United States Patent
Ma

(10) Patent No.: US 10,791,653 B2
(45) Date of Patent: Sep. 29, 2020

(54) COMPUTER SERVER

(71) Applicant: TuSimple, San Diego, CA (US)

(72) Inventor: Zhihua Ma, Beijing (CN)

(73) Assignee: TUSIMPLE, INC., San Diego, CA (US)

( * ) Notice: Subject to any disclaimer, the term of this patent is extended or adjusted under 35 U.S.C. 154(b) by 0 days.

(21) Appl. No.: 16/242,881

(22) Filed: Jan. 8, 2019

(65) Prior Publication Data

US 2019/0254196 A1 Aug. 15, 2019

(51) Int. Cl.
*H05K 7/20* (2006.01)
*H05K 7/14* (2006.01)

(52) U.S. Cl.
CPC ....... *H05K 7/20736* (2013.01); *H05K 7/1489* (2013.01); *H05K 7/1492* (2013.01); *H05K 7/2039* (2013.01); *H05K 7/20336* (2013.01); *H05K 7/20727* (2013.01); *H05K 7/20809* (2013.01); *H05K 7/20818* (2013.01)

(58) Field of Classification Search
CPC ....... H01L 23/467; H01L 23/473; G06F 1/20; G06F 1/181; G06F 1/206; G06F 1/183; G06F 2200/201; G06F 1/185; G06F 1/184; G06F 1/188; G06F 1/16; H05K 7/20836; H05K 7/20145; H05K 7/20736; H05K 7/20172; H05K 7/2039; H05K 1/0203; H05K 7/20772; H05K 7/20154; H05K 5/03; H05K 7/20336; H05K 7/20209; H05K 7/20727; H05K 7/20009; H05K 7/1488; H05K 7/1492; H05K 7/20818; H05K 7/20781; H05K 7/1489
See application file for complete search history.

(56) References Cited

U.S. PATENT DOCUMENTS

| | | | |
|---|---|---|---|
| 5,544,012 A * | 8/1996 | Koike ................ | H05K 7/20572 361/695 |
| 5,949,646 A * | 9/1999 | Lee ...................... | H05K 7/2019 165/104.33 |
| 6,222,729 B1 | 4/2001 | Yoshikawa | |
| 6,407,918 B1 * | 6/2002 | Edmunds ........... | H05K 7/20581 165/104.34 |

(Continued)

FOREIGN PATENT DOCUMENTS

CN 201369011 Y 12/2009
CN 201780546 U 3/2011

(Continued)

*Primary Examiner* — Adam B Dravininkas
(74) *Attorney, Agent, or Firm* — Paul Liu; Perkins Coie LLP

(57) ABSTRACT

The present application describes a computer server. The computer server includes a plurality of layers of fixed plates each having at least one corresponding component provided thereon. An air inlet and an air outlet are provided on side panels of an outer shell of the server case. A first set of fans is provided on an inward-facing side of the air inlet, and a second set of fans is provided on an inward-facing side of the air outlet. The first set of fans and the second set of fans generate a high-pressure airflow from the air inlet to the air outlet. The computer server further comprises at least one first heat sink and a second heat sink, wherein the at least one first heat sink is connected to a heat generating component on the plurality of layers of fixed plates.

24 Claims, 20 Drawing Sheets

(56) References Cited

U.S. PATENT DOCUMENTS

| | | | |
|---|---|---|---|
| 6,504,717 B1* | 1/2003 | Heard | H05K 7/2019 |
| | | | 165/104.33 |
| 6,888,725 B2 | 5/2005 | Kubo et al. | |
| 7,142,424 B2 | 11/2006 | Malone et al. | |
| 8,564,951 B1 | 10/2013 | Watanabe et al. | |
| 2004/0070949 A1 | 4/2004 | Oikawa et al. | |
| 2005/0047086 A1 | 3/2005 | Gedamu et al. | |
| 2005/0061485 A1* | 3/2005 | Hirafuji | F28D 15/0233 |
| | | | 165/104.21 |
| 2005/0231913 A1 | 10/2005 | Malone et al. | |
| 2005/0241802 A1 | 11/2005 | Malone et al. | |
| 2005/0241810 A1 | 11/2005 | Malone et al. | |
| 2006/0012955 A1* | 1/2006 | Vinson | H05K 7/20727 |
| | | | 361/695 |
| 2007/0070604 A1 | 3/2007 | Tomioka et al. | |
| 2008/0180896 A1* | 7/2008 | McClure | G06F 1/184 |
| | | | 361/727 |
| 2010/0220439 A1* | 9/2010 | Qin | G06F 1/203 |
| | | | 361/679.47 |
| 2011/0123036 A1* | 5/2011 | Barath | G10K 11/178 |
| | | | 381/71.3 |
| 2011/0164384 A1 | 7/2011 | Vogel et al. | |
| 2013/0329357 A1 | 12/2013 | Degner et al. | |
| 2014/0268550 A1 | 9/2014 | Kinstle et al. | |
| 2014/0268553 A1 | 9/2014 | Van Pelt et al. | |
| 2014/0321056 A1 | 10/2014 | Yoshikawa et al. | |
| 2015/0185772 A1* | 7/2015 | Arnouse | G06F 1/1628 |
| | | | 361/679.26 |
| 2015/0212556 A1 | 7/2015 | Hrehor, Jr. et al. | |
| 2016/0007501 A1 | 1/2016 | Nakanishi et al. | |
| 2017/0127573 A1 | 5/2017 | Hirai et al. | |
| 2018/0292145 A1 | 10/2018 | Sun et al. | |
| 2018/0372419 A1 | 12/2018 | Liu et al. | |

FOREIGN PATENT DOCUMENTS

| | | |
|---|---|---|
| CN | 201828912 U | 5/2011 |
| CN | 204464810 U | 7/2015 |
| CN | 104965565 A | 10/2015 |
| CN | 205384573 U | 7/2016 |
| CN | 205809805 U | 12/2016 |
| CN | 205810782 U | 12/2016 |

* cited by examiner

COMPUTER SERVER

CROSS-REFERENCED TO RELATED APPLICATION

This patent document claims the priority of and the benefits of Chinese Patent Application No. 201711088369.2 of the same title and content that was at the State Intellectual Property Office of China (SIPO) on Nov. 8, 2017. The entire disclosure of the above application is incorporated by reference in its entirety as part of this document.

TECHNICAL FIELD

The present disclosure relates to automated driving technology, and more particularly, to a computer server.

BACKGROUND

Currently, in order to achieve automated driving of a vehicle, typically one or even more vehicle-mounted computer servers for decision making and controlling will be provided on such vehicle. As complicated techniques are involved in automated driving, it is desired that the vehicle-mounted computer servers could have more powerful functions, with not only high computing capabilities and high processing efficiencies, but also capabilities of running stably for a long time (e.g., high anti-vibration capability and excellent cooling effect). Hence, compared with ordinary computer servers, a vehicle-mounted computer server may have a larger number of devices to be installed therein, e.g., a number of sets of core components, such as one or more power sources, a number of motherboards (having a number of Central Processing Units (CPUs) provided thereon), a number of graphics cards (each having a Graphics Processing Unit (GPU) provided thereon), a number of Universal Serial Bus (USB) expansion cards, one or more heat sinks, and the like.

Due to a limited space in a vehicle, a vehicle-mounted computer server cannot be designed to be too high or too wide. How to assemble a large number of core devices compactly, densely and orderly in a case having a limited space while ensuring that they can function stably has become a problem to be solved by those skilled in the art.

SUMMARY

A computer server is provided. The computer server includes, in an internal space of a case, a plurality of layers of fixed plates arranged in a vertical direction from a bottom of the case to a top of the case. Each of the plurality of layers of fixed plates has at least one corresponding component provided thereon. An air inlet is provided on a first side panel of an outer shell of the case, and an air outlet is provided on a second side panel of the outer shell of the case, the first side panel and the second side panel being opposite to each other. A first set of fans is provided on an inward-facing side of the air inlet, and a second set of fans is provided on an inward-facing side of the air outlet. The first set of fans and the second set of fans generate a high-pressure airflow from the air inlet to the air outlet. The component on each of the plurality of layers of fixed plates is cooled by the high-pressure airflow.

BRIEF DESCRIPTION OF THE DRAWINGS

The figures are provided for facilitating further understanding of the present disclosure. The figures constitute a portion of the description and can be used in combination with the embodiments of the present disclosure to interpret, rather than limiting, the present disclosure. In the figures.

DETAILED DESCRIPTION OF THE EMBODIMENTS

Figure 1:
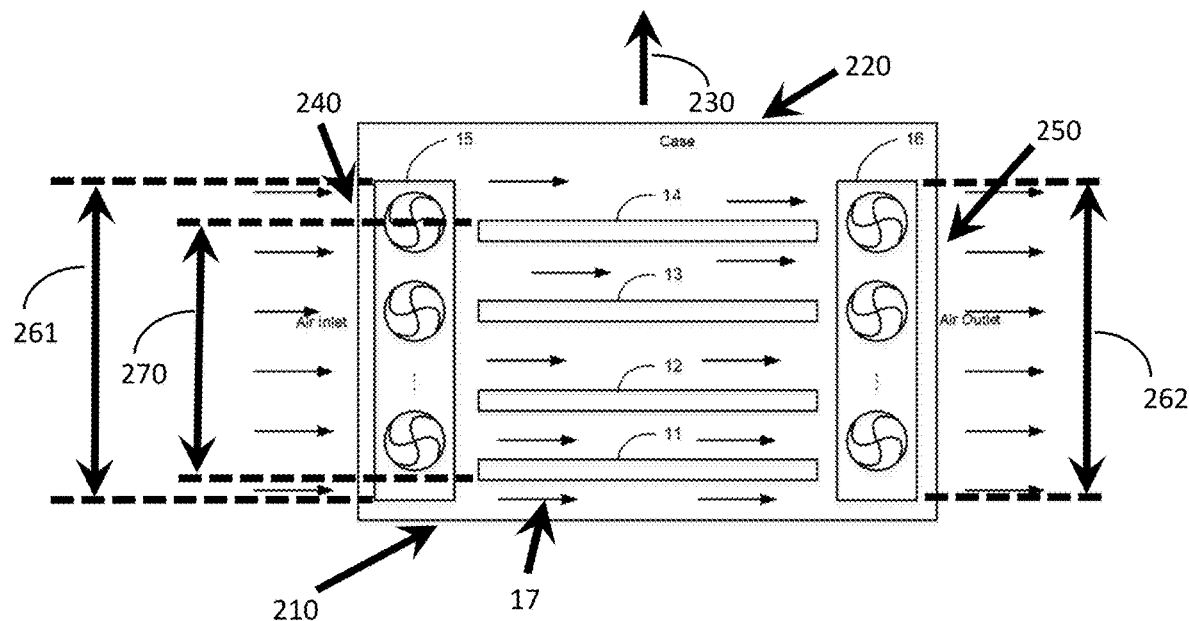
FIG. 1 is a schematic diagram showing a structure of a computer server according to Embodiment 1 of the present disclosure.

In the following, the solutions according to the embodiments of the present disclosure will be described clearly and completely with reference to the figures, such that the solutions can be better understood by those skilled in the art. Obviously, the embodiments described below are only some, rather than all, of the embodiments of the present disclosure. All other embodiments that can be obtained by those skilled in the art based on the embodiments described in the present disclosure without any inventive efforts are to be encompassed by the scope of the present disclosure.

With the computer server according to the embodiment of the present disclosure, in the internal space of the case, a plurality of layers of fixed plates are arranged in a vertical direction and each of the plurality of layers of fixed plates has at least one component provided thereon. An air inlet and an air outlet are provided on two opposite panels of the outer shell of the case, such that a high-pressure airflow from the air inlet to the air outlet can be generated for cooling the components on the respective layers of fixed plates. With the solution according to the present disclosure, on one hand, the vertical space in the case may be designed reasonably to avoid arranging all the components on one single layer, which would otherwise result in a horizontal dimension that is too long. The respective layers of components are separated from each other by the fixed plates, such that the layers of components may be arranged orderly without confusion. On the other hand, two sets of fans are provided on the two opposite side panels of the case, capable of generating a high-pressure airflow from the air inlet to the air outlet. The high-pressure airflow may pass through the components on the respective layers of fixed plates arranged in the vertical direction. That is, the components on the respective layers of fixed plates may be cooled by the high-pressure airflow, thereby ensuring that the heat generating components may function stably.

The computer server according to the embodiment of the present disclosure may be applied to a vehicle side in an unmanned vehicle, a robot, or any other scenarios in which a volume of space of the computer server is required. The present disclosure is not limited to any specific application scenario.

The computer server according to the embodiment of the present disclosure includes, in an internal space of a case, a plurality of layers of fixed plates arranged in a vertical direction from a bottom of the case to a top of the case. Each of the plurality of layers of fixed plates has at least one corresponding component provided thereon. An air inlet is provided on a first side panel of an outer shell of the case, and an air outlet is provided a second side panel of the outer shell of the case, the first side panel and the second side panel being opposite to each other. A first set of fans is provided on an inward-facing side of the air inlet, and a second set of fans is provided on an inward-facing side of the air outlet. The first set of fans and the second set of fans generate a high-pressure airflow from the air inlet to the air outlet. The component on each of the plurality of layers of fixed plates is cooled by the high-pressure airflow.

In some embodiments of the present disclosure, the number of layers of fixed plates provided in the case may be configured flexibly depending on actual situations and the present disclosure is not limited to any specific number. For example, four, five or six layers of fixed plates may be provided. In the following, the structure of the computer server according to the embodiments of the present disclosure will be described in detail with reference to examples where four and six layers of fixed plates are provided.

Embodiment 1

According to Embodiment 1 of the present disclosure, a computer server including four layers of fixed plates is provided. As shown in FIG. 1, a plurality of fixed plates, such as plates 11, 12, 13 and 14, is provided inside a computer server case and the fixed plates 11-14 are structured to include heat-generating server components or modules such as one or more central processing units (CPUs), one or more graphics processing units (GPUs), data storage related circuitry or other circuitry. In an internal space of the server case, a first layer of fixed plate 11, a second layer of fixed plate 12, a third layer of fixed plate 13 and a fourth layer of fixed plate 14 are arranged in a vertical direction 230 from a bottom of the case to a top of the case. The first layer of fixed plate 11 has a motherboard, a hard drive and a power source as components provided thereon. The second layer of fixed plate 12 has at least one graphics card as a component provided thereon. The third layer of fixed plate 13 has at least one graphics card as a component provided thereon. The fourth layer of fixed plate 14 has at least one expansion card as a component provided thereon. An air inlet 240 is provided on a first side panel of an outer shell of the case, and an air outlet 250 is provided a second side panel of the outer shell of the case, the first side panel and the second side panel being opposite to each other. The sizes of the air inlet 240 and air outlet 250 can be generally represented by the height or size 261 of the air inlet in the vertical direction 230 and the height or size 262 of the air outlet in the vertical direction 230 which are shown to be equal to or greater than a size 270 in the vertical direction 230 of a spatial area occupied by the plurality of layers of fixed plates 11-14. Thence, the height 261 of the air inlet 240 and the height 262 of the air outlet 250 in the vertical direction 230 are equal to or greater than the height 270 of the plurality of layers of fixed plates 11-14 in the vertical direction 230. As part of the cooling mechanism of the server case, a first set of fans 15 is provided on an inward-facing side of the air inlet 240, and a second set of fans 16 is provided on an inward-facing side of the air outlet 250. The first set of fans 15 and the second set of fans 16 generate a high-pressure airflow traveling in a straight direction 17 from the air inlet 240 to the air outlet 250. Under this design, the high-pressure airflow flows through the plurality of layers of plates 11-14 to bring the heated air out of the computer server case via the air outlet 250, thus providing efficient cooling of the plurality of layers of plates 11-14.

In some embodiments of the present disclosure, the first layer of fixed plate 11, the second layer of fixed plate 12, the third layer of fixed plate 13 and the fourth layer of fixed plate 14 may be mounted on a third side panel and a fourth side panel (the third side panel and the fourth side panel being opposite to each other) of the outer shell of the case. For example, slots may be provided on the third side panel and the fourth side panel for mounting the first layer of fixed plate 11, the second layer of fixed plate 12, the third layer of fixed plate 13 and the fourth layer of fixed plate 14. Alternatively, the first layer of fixed plate 11, the second layer of fixed plate 12, the third layer of fixed plate 13 and the fourth layer of fixed plate 14 may be mounted fixedly to the third side panel and the fourth side panel by means of welding or fastening by screws. The present disclosure is not limited to these embodiments.

Figure 2:
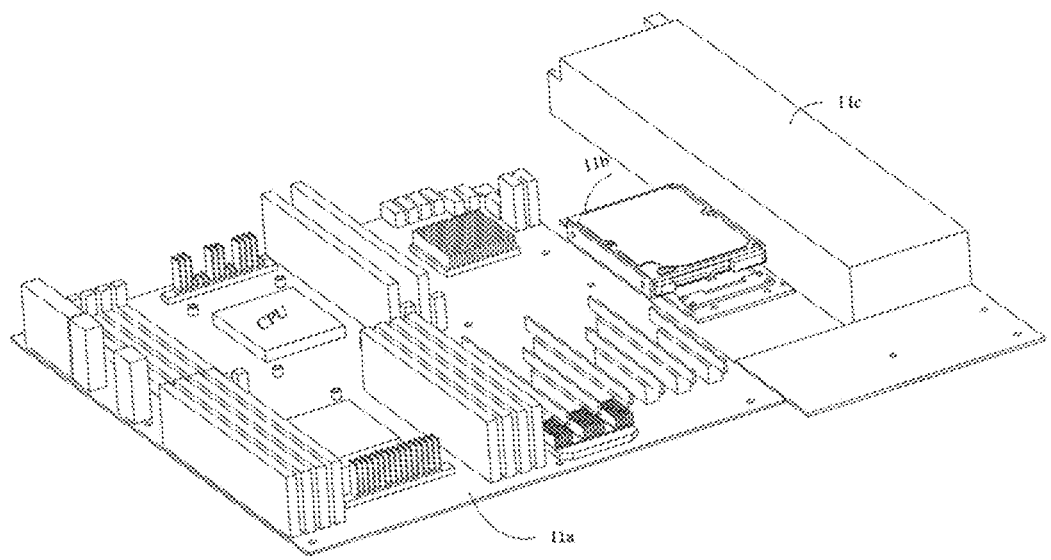
FIG. 2 is a schematic diagram showing a structure of a first layer of fixed plate according to Embodiment 1 of the present disclosure.

As shown in FIG. 2, which is a schematic diagram showing a structure of the first layer of fixed plate 11, a motherboard 11a, a hard drive 11b and a power source 11c are provided on the first layer of fixed plate 11. The motherboard 11a includes two CPUs. Of course, the layout of the motherboard 11a, the hard drive 11b and the power source 11c on the first layer of fixed plate 11 is not limited to the one shown in FIG. 2 and can be configured flexibly by those skilled in the art. For example, the hard drive 11b and the power source 11c may be arranged on the left side in FIG. 2 and the motherboard 11a may be arranged on the right side in FIG. 2. The present disclosure is not limited to any specific layout.

Figure 3:
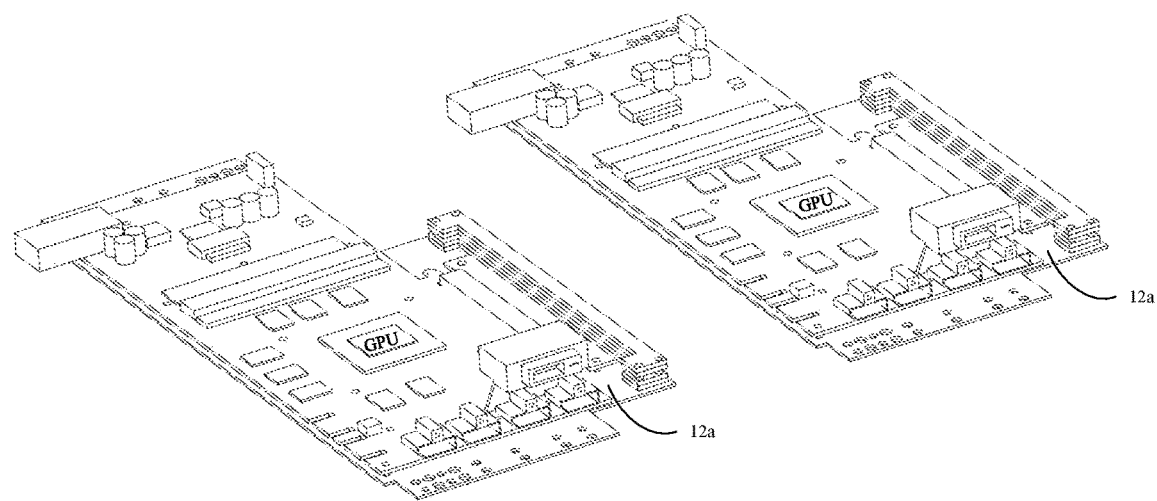
FIG. 3 is a schematic diagram showing a structure of a second layer of fixed plate according to Embodiment 1 of the present disclosure.

As shown in FIG. 3, which is a schematic diagram showing a structure of the second layer of fixed plate 12, two graphics cards 12a are provided on the second layer of fixed plate 12, each including a GPU. Of course, the layout of the two graphics card 12a is not limited to the one shown in FIG. 3 and may be configured flexibly by those skilled in the art.

Figure 4:
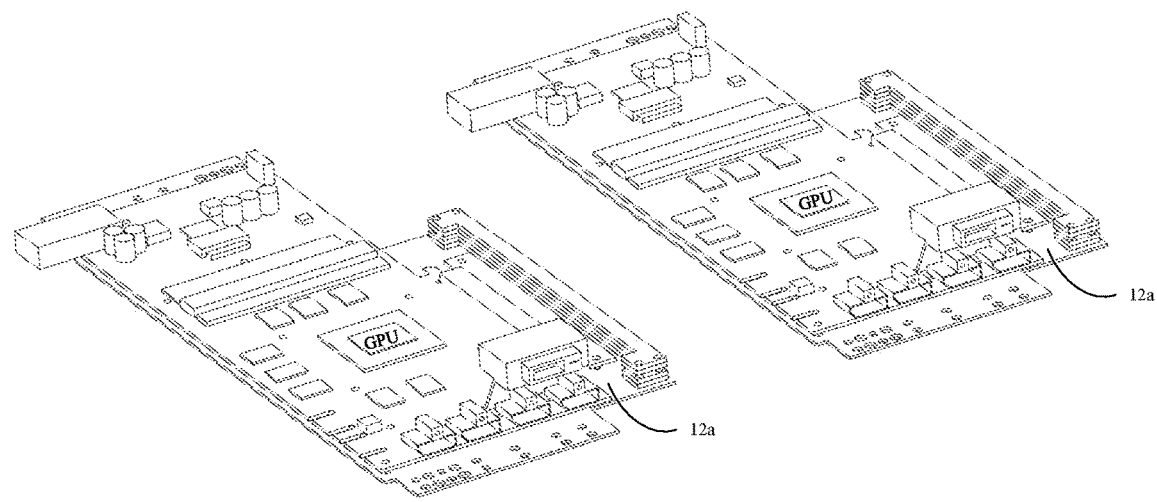
FIG. 4 is a schematic diagram showing a structure of a third layer of fixed plate according to Embodiment 1 of the present disclosure.

As shown in FIG. 4, which is a schematic diagram showing a structure of the third layer of fixed plate 13, two graphics cards 12a are provided on the third layer of fixed plate 13, each including a GPU.

Figure 5:
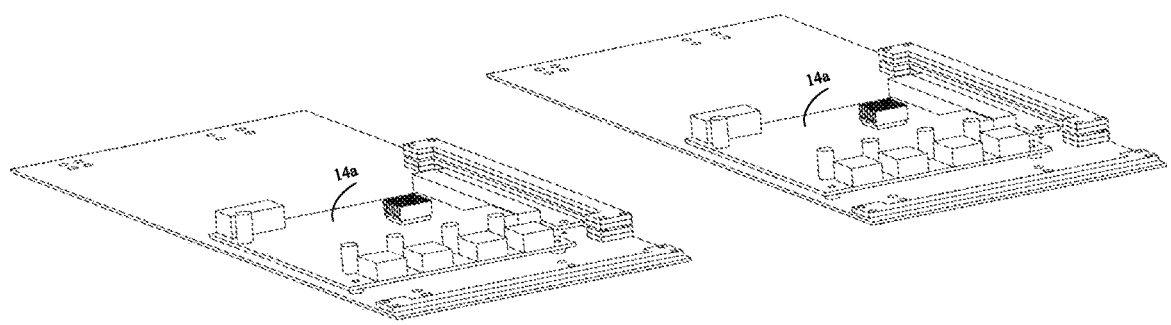
FIG. 5 is a schematic diagram showing a structure of a fourth layer of fixed plate according to Embodiment 1 of the present disclosure.

As shown in FIG. 5, which is a schematic diagram showing a structure of the fourth layer of fixed plate 14, two expansion cards 14a (which can be USB expansion cards) are provided on the fourth layer of fixed plate 14.

In some embodiments, the first layer of fixed plate 11, the second layer of fixed plate 12, the third layer of fixed plate 13 and the fourth layer of fixed plate 14 are not necessarily mounted in any strict order in the vertical direction. From the bottom to the top of the case, they may be arranged in the order of the first layer of fixed plate 11, the second layer of fixed plate 12, the third layer of fixed plate 13 and the fourth layer of fixed plate 14, in the order of the fourth layer of fixed plate 14, the third layer of fixed plate 13, the second layer of fixed plate 12 and the first layer of fixed plate 11, or in the order of the fourth layer of fixed plate 14, the first layer of fixed plate 11, the second layer of fixed plate 12 and the third layer of fixed plate 13. The present disclosure is not limited to any of these orders.

Figure 6:
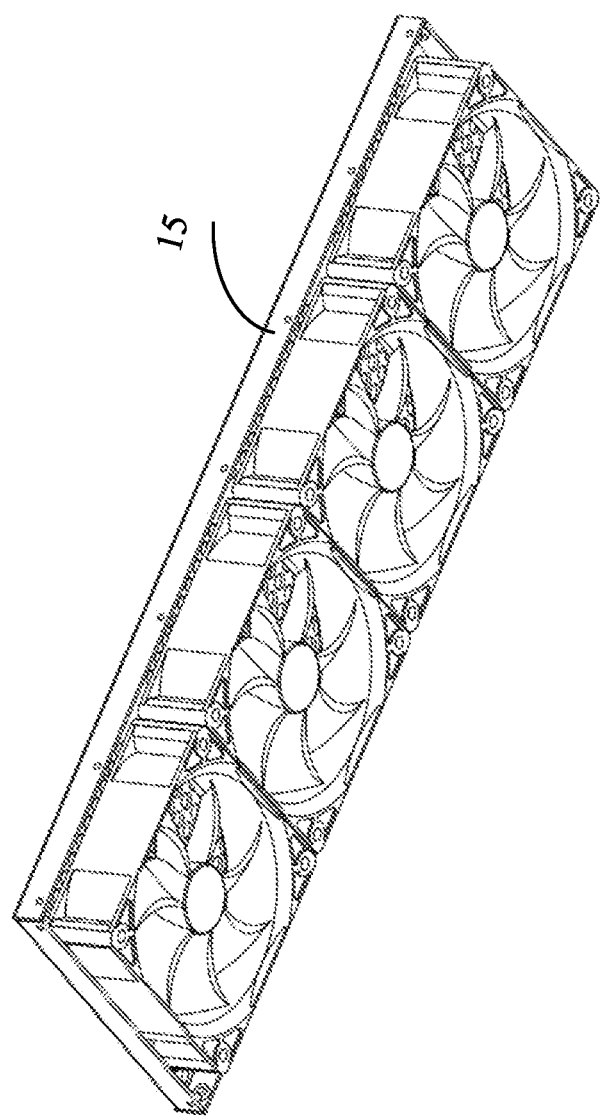
FIG. 6 is a schematic diagram showing a structure of a first set of fans according to Embodiment 1 of the present disclosure.
Figure 7:
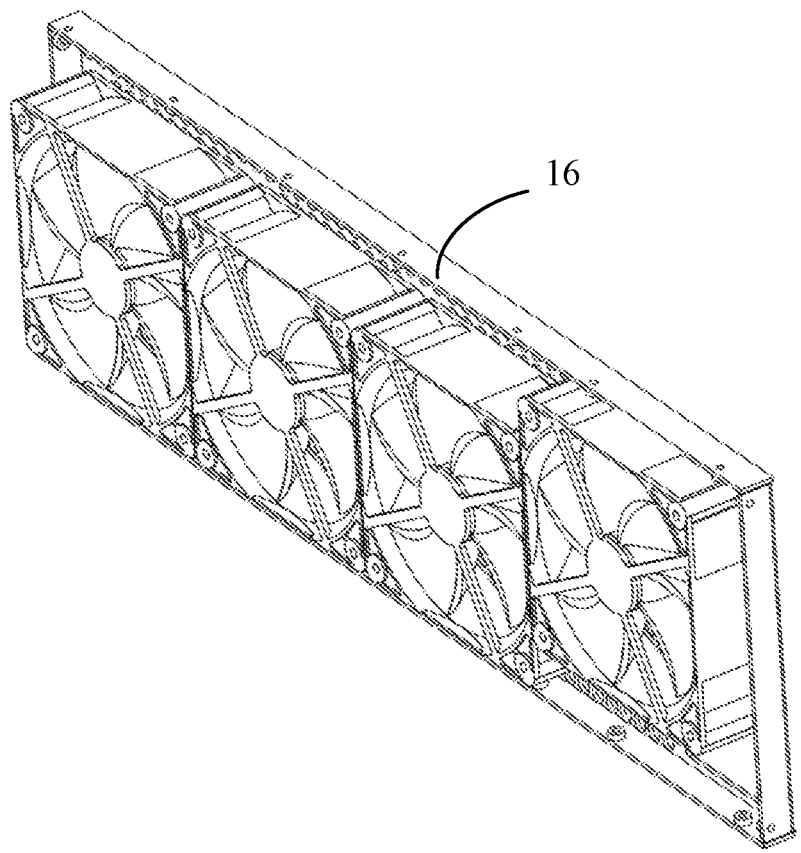
FIG. 7 is a schematic diagram showing a structure of a second set of fans according to Embodiment 1 of the present disclosure.

In some embodiments of the present disclosure, the first set of fans 15 and the second set of fans 16 may each include a plurality of fans. The number of fans in each set may be configured flexibly depending on actual requirements. For example, the more components for which heat dissipation is desired, or the larger the space for which heat dissipation is desired, the more fans may be to be mounted. FIG. 6 is a schematic diagram showing a structure of the first set of fans 15. FIG. 7 is a schematic diagram showing a structure of the second set of fans 16. In FIGS. 6 and 7, the first set of fans 15 and the second set of fans 16 each include four fans.

In order to further increase the speed of heat dissipation for the heat generating components, in some embodiments of the present disclosure, a first heat sink 17 and a second heat sink 18 may be also provided in the case.

The first heat sink 17 may be connected to the heat generating components, for absorbing heat from the heat generating components and transferring the absorbed heat to the second heat sink 18. Here, the heat generating components include the CPUs on the motherboard on the first layer of fixed plate 11 and the GPUs on the graphics cards on the second layer of fixed plate 12 and the third layer of fixed plate 13.

The second heat sink 18 is mounted on an inward-facing side of the second set of fans 16 and cooled by the high-pressure airflow.

In some embodiments of the present disclosure, the first heat sink 17 may transfer the heat generated by the heat generating components directly to the second heat sink 18, and then the first set of fans 15 and the second set of fans 16 generate a high-pressure airflow for cooling the second heat sink 18. With the embodiments of the present disclosure, the first heat sink 17 may transfer the heat generated by the heat generating components directly and quickly to the second heat sink 18, so as to increase the speed of heat dissipation and ensure that the heat generating components may function stably. Further, the second heat sink 18 may be arranged near the air outlet on the outer shell of the case, such that the high-pressure airflow may dissipate the heat on the second heat sink 18 quickly to the outside of the case, thereby further increasing the speed of heat dissipation and improving the cooling effect.

In some embodiments of the present disclosure, the second heat sink 18 may be configured as cooling fins formed in one piece, or a plurality of sets of cooling fins. This may be configured flexibly by those skilled in the art depending on actual requirements and the present disclosure is not limited to any of these configurations.

In some embodiments of the present disclosure, the first heat sink 17 may have any of the following structures.

Structure 1: The first heat sink 17 may include a plurality of sets of heat pipes 171, each set of heat pipes 171 corresponding to one heat generating component.

Structure 2: The first heat sink 17 may include a plurality of turbofan heat sinks 172 each corresponding to one heat generating component.

Structure 3: The first heat sink 17 may include at least one set of heat pipes 171 and at least one turbofan heat sink 172, each set of heat pipes 171 corresponding to one heat generating component and each turbofan heat sink 172 corresponding to one heat generating component.

In addition to the above Structures 1, 2 and 3, in some embodiments of the present disclosure, the first heat sink 17 may include at least one water cooling device each corresponding to a plurality of heat generating components and including a water cooling pipe and a water tank arranged cyclically. The water cooling pipe may have a water inlet and a water outlet each connected to the water tank. Water in the water cooling pipe, when flowing through one heat generating component, may carry heat generated by the one heat generating component to the second heat sink 18 and then flow from the second heat sink 18 and through a next heat generating component.

In the following, the above Structures 1, 2 and 3 will be described in detail with reference to the figures, such that the structures of the above heat pipe 171 and turbofan heat sink 172 can be better understood by those skilled in the art.

Example 1

Figure 8A:
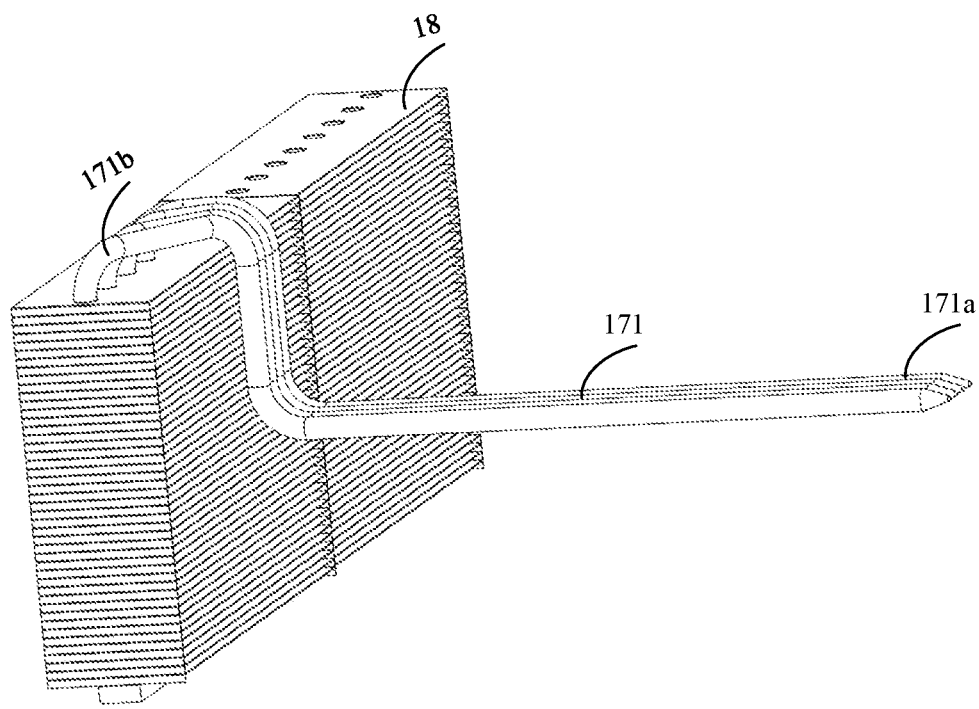
FIG. 8A is a schematic diagram showing a structure of a set of heat pipes in a first heat sink according to Embodiment 1 of the present disclosure.

Referring to FIG. 8A, which is a schematic diagram showing a structure of a first heat sink 17 according to some embodiments of the present disclosure, the first heat sink 17 includes a plurality of sets of heat pipes 171. Each set of heat pipes 171 corresponds to one heat generating component and includes at least one heat pipe each having one end 171a connected to the one heat generating component and another end 171b connected to the second heat sink 18.

In some embodiments of the present disclosure, for different heat generating components, different numbers of heat pipes may be included in their corresponding sets of heat pipes. For example, the higher the power of the heat generating component is, the larger number of heat pipes its corresponding set of heat pipes may include.

In order to further increase the contact area between the heat pipes and the heat generating component and thus the speed at which the heat pipes absorb the heat, in some embodiments of the present disclosure, the heat generating component may have its surface coated with a layer of thermally conductive silicone grease. The one end 171a of each heat pipe in each set of heat pipes may be connected to the heat generating component via one first mounting device.

Figure 8B:
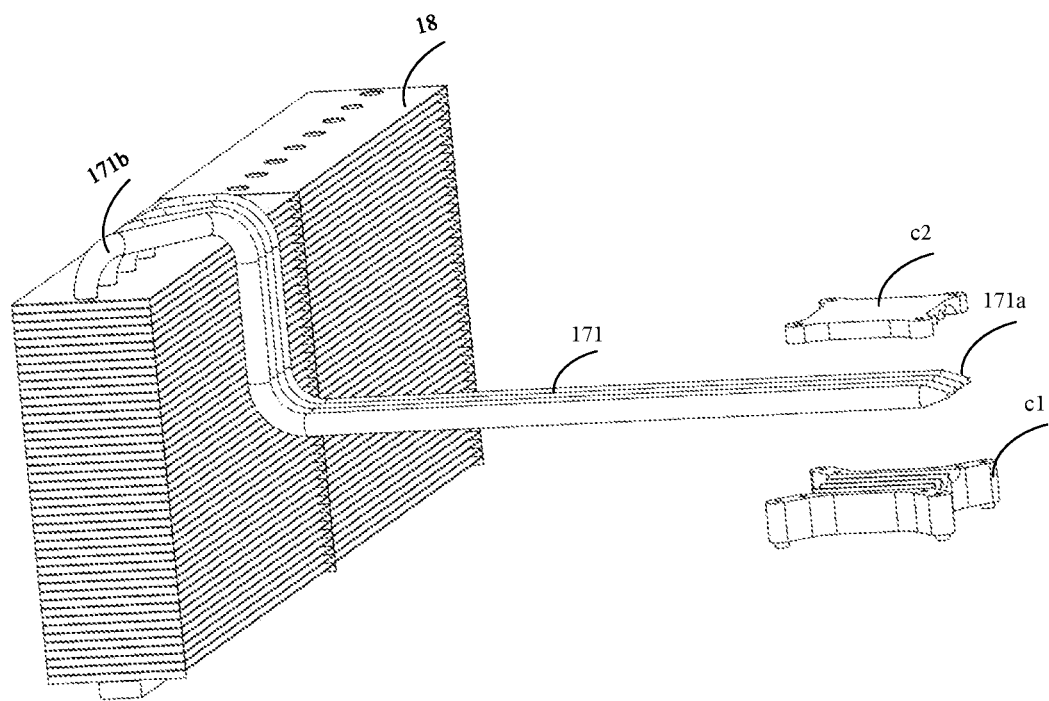
FIG. 8B is a schematic diagram showing a structure of a first mounting device according to Embodiment 1 of the present disclosure.

In an example, the first mounting device may have a structure shown in FIG. 8B. As shown, the first mounting device may include a heat pipe base c1 and a heat pipe cover c2. The heat pipe base c1 may be mounted fixedly on the thermally conductive silicone grease for the heat generating component and has at least one groove or slot provided on its top for mounting the at least one heat pipe. The one end 171a of each heat pipe in each set of heat pipes is pressed tightly onto the heat pipe base c1 by the heat pipe cover c2. The heat pipe base c1 and the heat pipe cover c2 may be fastened to each other by screws or bolts.

Of course, in another example, the first mounting device may include a heat pipe base and a heat pipe cover. The heat pipe base may be mounted fixedly on the thermally conductive silicone grease for the heat generating component, and the heat pipe cover may have at least one groove or slot provided at its bottom for mounting the at least one heat pipe. The one end 171a of each heat pipe in each set of heat pipes is pressed tightly onto the heat pipe base by the heat pipe cover. The heat pipe base and the heat pipe cover may be fastened to each other by screws or bolts.

Of course, in another example, the first mounting device can include a heat pipe base, which is mounted fixedly on the thermally conductive silicone grease for the heat generating component. The one end 171a of each heat pipe in each set of heat pipes is welded to the heat pipe base.

In order to further increase the speed of heat dissipation, in some embodiments of the present disclosure, each of the heat pipe cover c2 and the heat pipe base c1 of the above first mounting device may have its surface coated uniformly with a layer of thermally conductive silicone grease, and/or the one end 171a of the heat pipe may have its surface coated uniformly with a layer of thermally conductive silicone grease.

In some embodiments of the present disclosure, the heat pipe may include a pipe shell, a wick within the pipe shell and a pipe cover for sealing the pipe shell. The pipe shell may be filled with a volatile liquid having a low boiling point.

In some embodiments of the present disclosure, the wick may be made of a porous material.

In some embodiments of the present disclosure, air may be drawn out to form a negative pressure of $1.3*10^{-1} \sim 1.3*10^{-4}$ Pa inside the pipe shell and then the pipe shell may be filled with the volatile liquid having the low boiling point. When the wick is filled with the liquid, the pipe shell may be sealed with the pipe cover.

The principle of the heat pipe absorbing the heat from the heat generating component and transferring the absorbed heat to the second heat sink 18 may be as follows. When the one end 171a of the heat pipe is heated, the liquid in the wick may be vaporized into vapor and the heat generated by the heat generating component may be absorbed during the vaporization of the liquid. The vapor flows may toward the other end 171b of the heat pipe, subject to a small pressure, and may be liquefied into a liquid when meeting the second heat sink 18 having a relatively low temperature at the other end 171b (as the second heat sink 18 is continuously cooled by the high-pressure airflow, it has a lower temperature than the heat pipe 171). During the liquefaction of the vapor, heat may be released to the second heat sink 18. The liquid may flow back to the one end 171a, subject to a capillary force of the wick. Cyclically in this way, the heat generated by the heat generating component may be transferred to the second heat sink 18.

In some embodiments of the present disclosure, the material of the heat pipe and the type of the liquid may be any of the following: 1) the pipe shell of the heat pipe may be made of copper and the liquid may be water; 2) the pipe shell of the heat pipe may be made of carbon steel and the liquid may be water; 3) the pipe shell of the heat pipe may be made of a composite of steel and copper and the liquid may be water; 4) the pipe shell of the heat pipe may be made of aluminum and the liquid may be acetone; or 5) the pipe shell of the heat pipe may be made of stainless steel and the liquid may be sodium.

For example, each CPU on the motherboard may correspond to a set of five heat pipes each having a diameter of 6 mm and each GPU on the graphics card may correspond to a set of four heat pipes each having a diameter of 6 mm. The liquid filled in each heat pipe may be water.

In some embodiments of the present disclosure, the other end 171b of each heat pipe in each set of heat pipes may be connected to the second heat sink 18 by means of welding.

In some embodiments of the present disclosure, the heat pipe may have a shape of a prism, e.g., a cylinder or cuboid, and the present disclosure is not limited thereto.

Figure 8C:
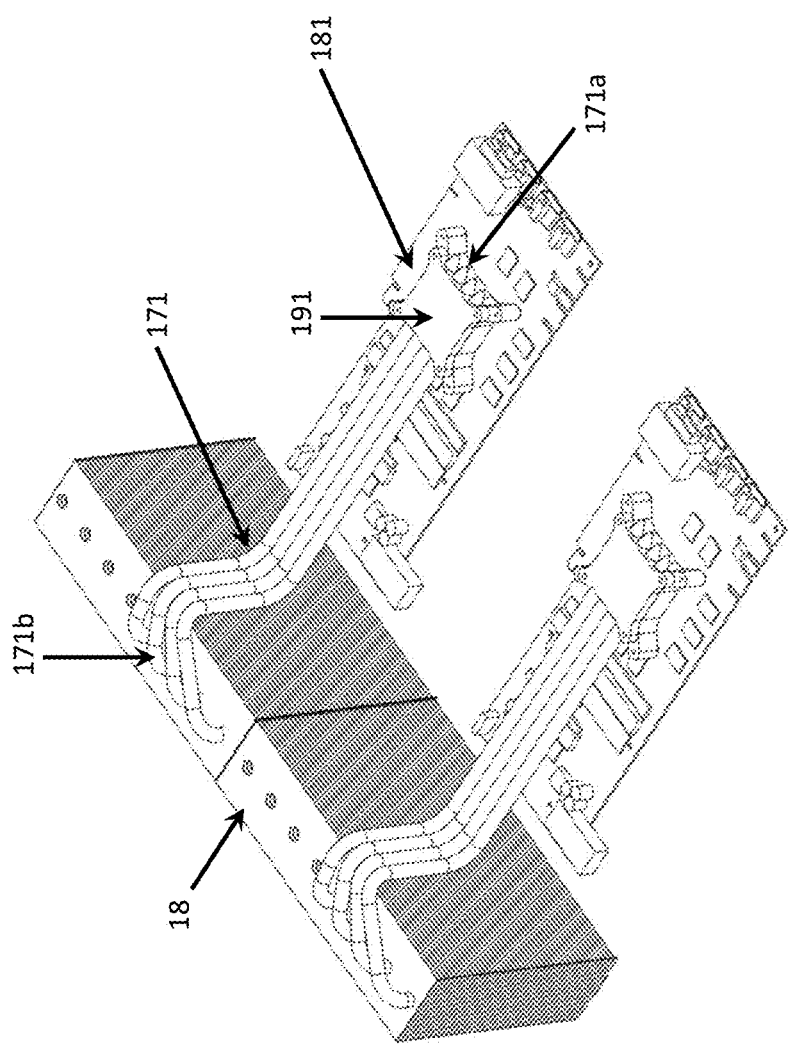
FIG. 8C is a schematic diagram showing each GPU on a second layer of fixed plate corresponding to a set of heat pipes according to Embodiment 1 of the present disclosure.
Figure 8D:
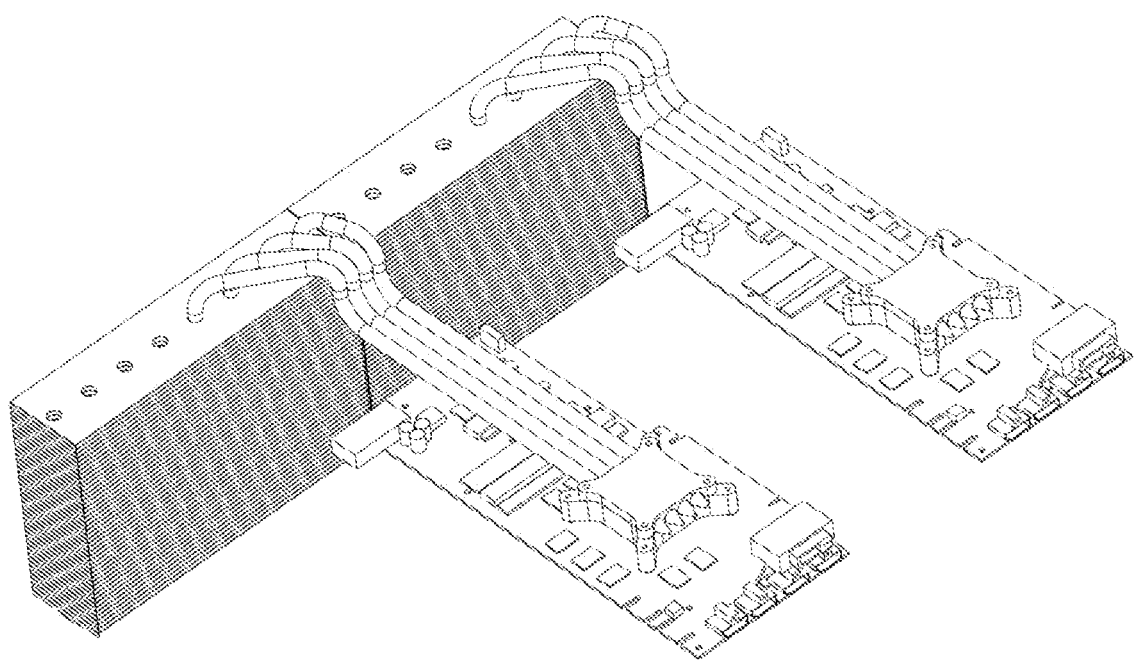
FIG. 8D is a schematic diagram showing each GPU on a third layer of fixed plate corresponding to a set of heat pipes according to Embodiment 1 of the present disclosure.
Figure 8E:
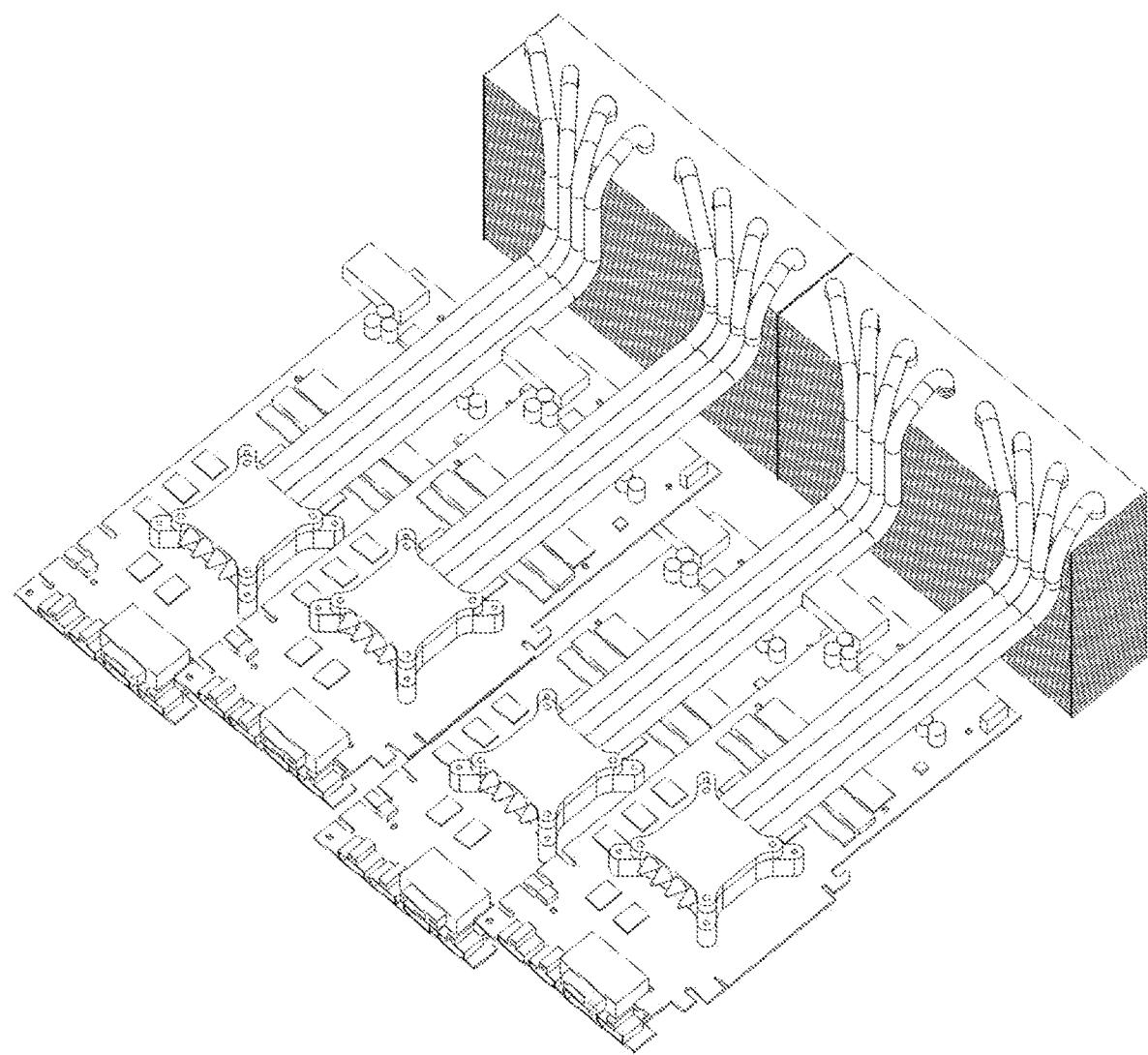
FIG. 8E is a schematic diagram showing each of four GPUs in four graphics cards on a second layer of fixed plate and a third layer of fixed plate corresponding to a set of heat pipes according to Embodiment 1 of the present disclosure.

FIG. 8C is a schematic diagram showing each GPU in the graphics card 12a on the second layer of fixed plate 12 corresponding to a set of heat pipes. FIG. 8C shows a set of heat pipes 171 connected to a heat generating component (GPU) 181 such that the one end 171a of a heat pipe in the set of heat pipes is connected to the heat generating component via a first mounting device 191 and another end 171b of the heat pipe in the set of heat pipes is connected to a second heat sink 18. FIG. 8D is a schematic diagram showing each GPU in the graphics card 12a on the third layer of fixed plate 13 corresponding to a set of heat pipes. FIG. 8E is a schematic diagram showing each of the GPUs on the second layer of fixed plate 12 and the third layer of fixed plate 13 corresponding to a set of heat pipes, the other end 171b of each of the four sets of heat pipes being connected to the second heat sink 18.

Example 2

Figure 9A:
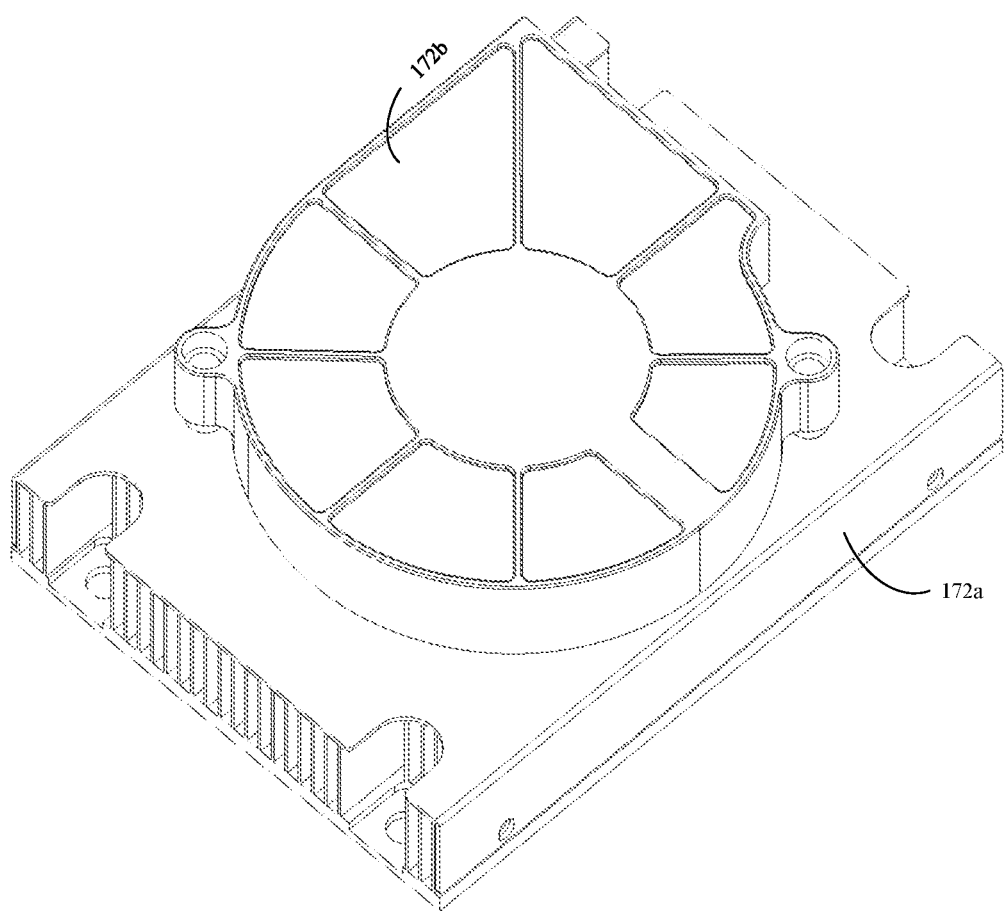
FIG. 9A is a schematic diagram showing a structure of a turbofan heat sink in a first heat sink according to Embodiment 1 of the present disclosure.
Figure 9B:
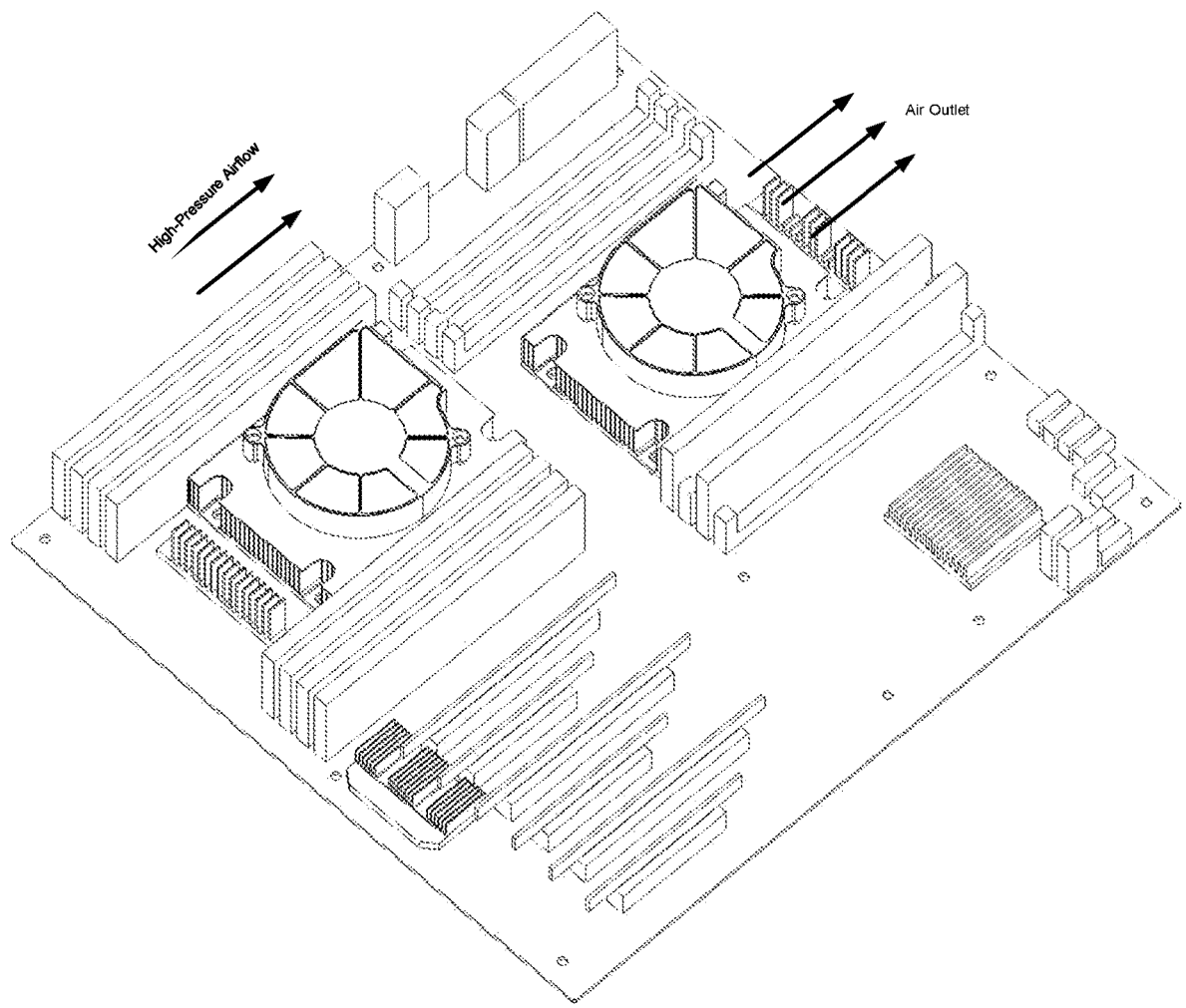
FIG. 9B is a schematic diagram showing each CPU on a first layer of fixed plate corresponding to a turbofan heat sink according to Embodiment 1 of the present disclosure.

Referring to FIG. 9A, which shows another structure of a first heat sink 17 according to some embodiments of the present disclosure, the first heat sink 17 includes a plurality of turbofan heat sinks 172 each corresponding to one heat generating component. Each of the plurality of turbofan heat sinks 172 includes a cooling fin 172a connected to the heat generating component and a turbofan 172b. The turbofan 172b has an air outlet facing a same direction as the high-pressure airflow. The turbofan 172b draws air to blow heat on the cooling fin 172a to the second heat sink 18. As shown in FIG. 9B, each CPU on the first layer of fixed plate 11 corresponds to one turbofan heat sink 172.

Preferably, in order to further increase the contact area between the turbofan heat sink 172 and the heat generating component and thus the speed at which the heat is absorbed, in some embodiments of the present disclosure, the heat generating component may have its surface coated with a layer of thermally conductive silicone grease. The cooling fin 172a of the turbofan heat sink 172 may be mounted fixedly on the thermally conductive silicone grease for the heat generating component.

Example 3

According to an embodiment of the present disclosure, in a further example of a first heat sink 17, the first heat sink 17 may include at least one set of heat pipes 171 and at least one turbofan heat sink 172, each set of heat pipes 171 corresponding to one heat generating component and each turbofan heat sink 172 corresponding to one heat generating component. For the structures of the heat pipe 171 and the turbofan heat sink 172, reference can be made to the above Example 1 and Example 2 and details thereof will be omitted here.

For example, some of the heat generating components in the case may each have a turbofan heat sink 172 provided thereon and some of the heat generating components in the case may each have heat pipes 171 provided thereon. For example, each CPU on the first layer of fixed plate 11 may correspond to a turbofan heat sink 172, and each GPU on the second layer of fixed plate 12 and the third layer of fixed plate 13 may correspond to a set of heat pipes 171. As another example, each CPU on the first layer of fixed plate 11 may correspond to a set of heat pipes 171 and each GPU on the second layer of fixed plate 12 and the third layer of fixed plate 13 may correspond to a turbofan heat sink 172. This can be selected flexibly by those skilled in the art depending on actual requirements and the present disclosure is not limited thereto.

Figure 10:
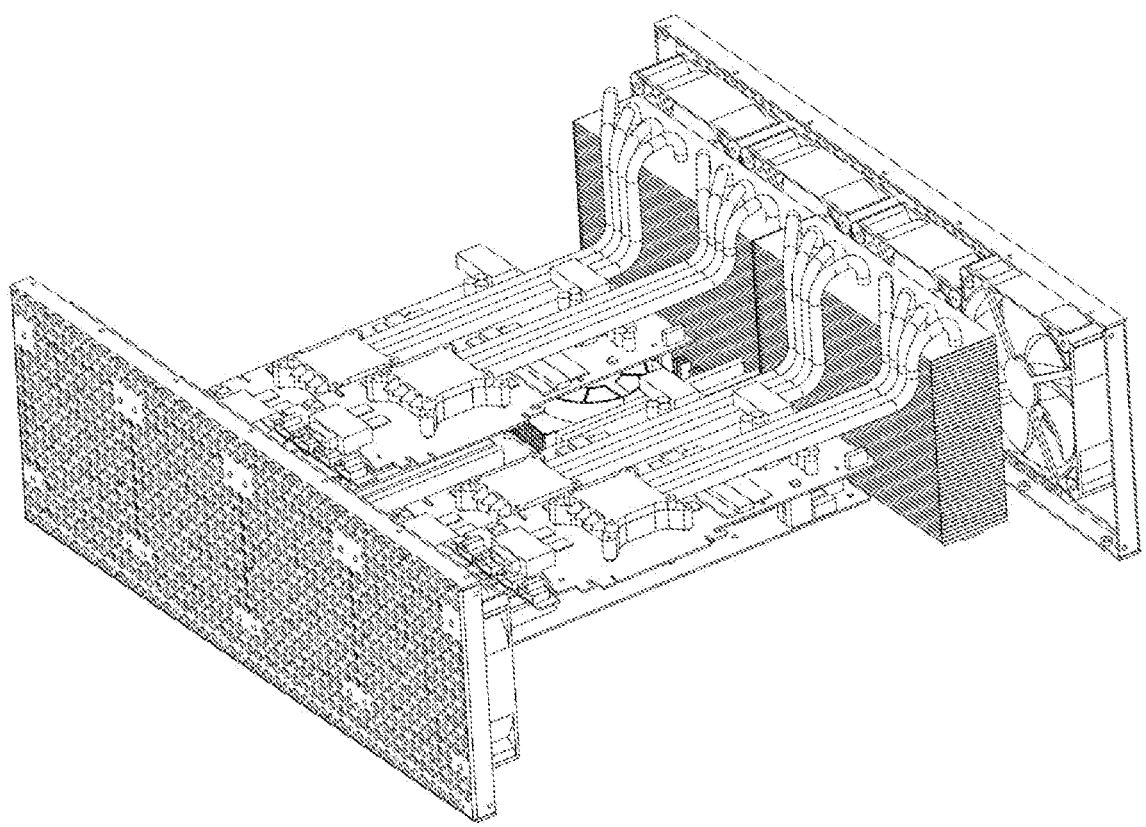
FIG. 10 is a schematic diagram showing a structure in which a first layer of fixed plate, a second layer of fixed plate, a third layer of fixed plate and two sets of fans are assembled together according to Embodiment 1 of the present disclosure.

FIG. 10 is a schematic diagram showing a structure in which the first layer of fixed plate 11, the second layer of fixed plate 12, the third layer of fixed plate 13, the first set of fans 15 and the second set of fans 16 are assembled together.

Figure 11:
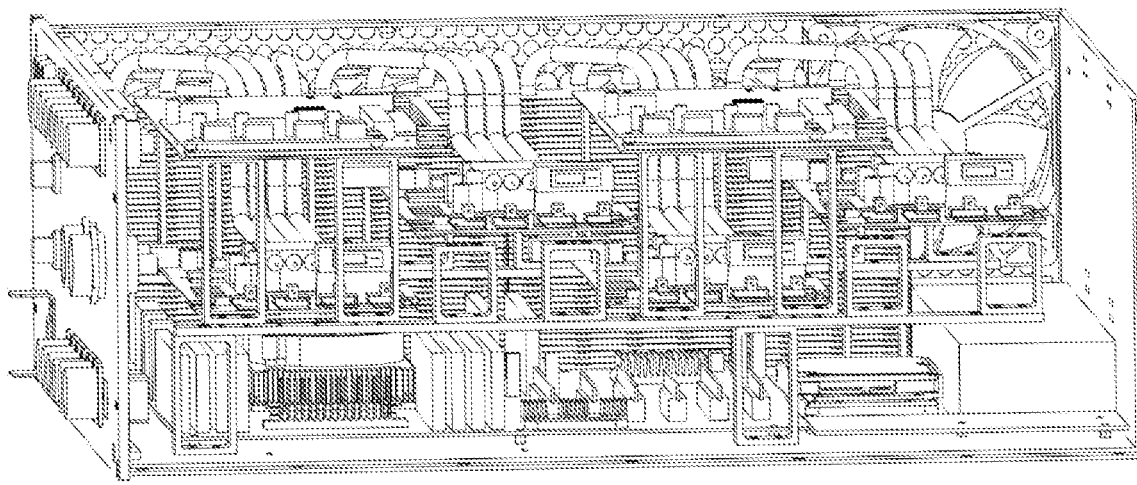
FIG. 11 is a schematic diagram showing a structure in which four layers of fixed plates are assembled together according to Embodiment 1 of the present disclosure.

FIG. 11 is a schematic diagram showing a structure in which the first layer of fixed plate 11, the second layer of fixed plate 12, the third layer of fixed plate 13 and the fourth layer of fixed plate 14 are assembled together according to an embodiment of the present disclosure.

Figure 12:
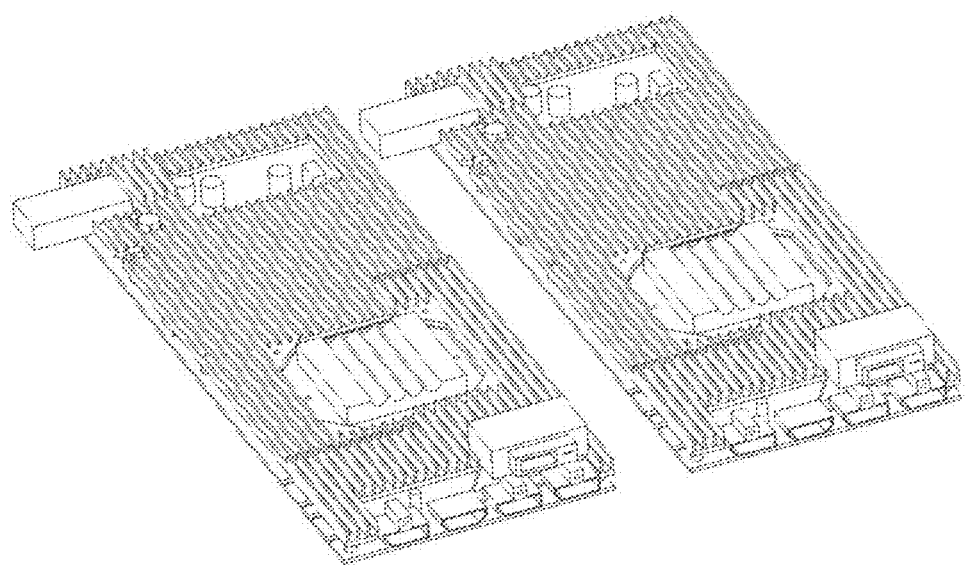
FIG. 12 is a schematic diagram showing a layer of cooling fins provided on a surface of a graphics card according to Embodiment 1 of the present disclosure.

In order to further improve the efficiency of heat dissipation, in some embodiments of the present disclosure, a layer of cooling fins may be provided on a surface of the motherboard on the first layer of fixed plate 11, for absorbing heat generated by other components on the motherboard. Additionally or alternatively, a layer of cooling fins may be provided on a surface of each graphics card on the second layer of fixed plate 12 and the third layer of fixed plate 13, for absorbing heat generated by other components on the graphics card. The layer of cooling fins provided on the surface of the motherboard and the layer of cooling fins provided on the surface of the graphics card may be cooled using a high-pressure airflow. As shown in FIG. 12, a layer of cooling fins is provided on a surface of a graphics card on the second layer of fixed plate 12.

Embodiment 2

Figure 13:
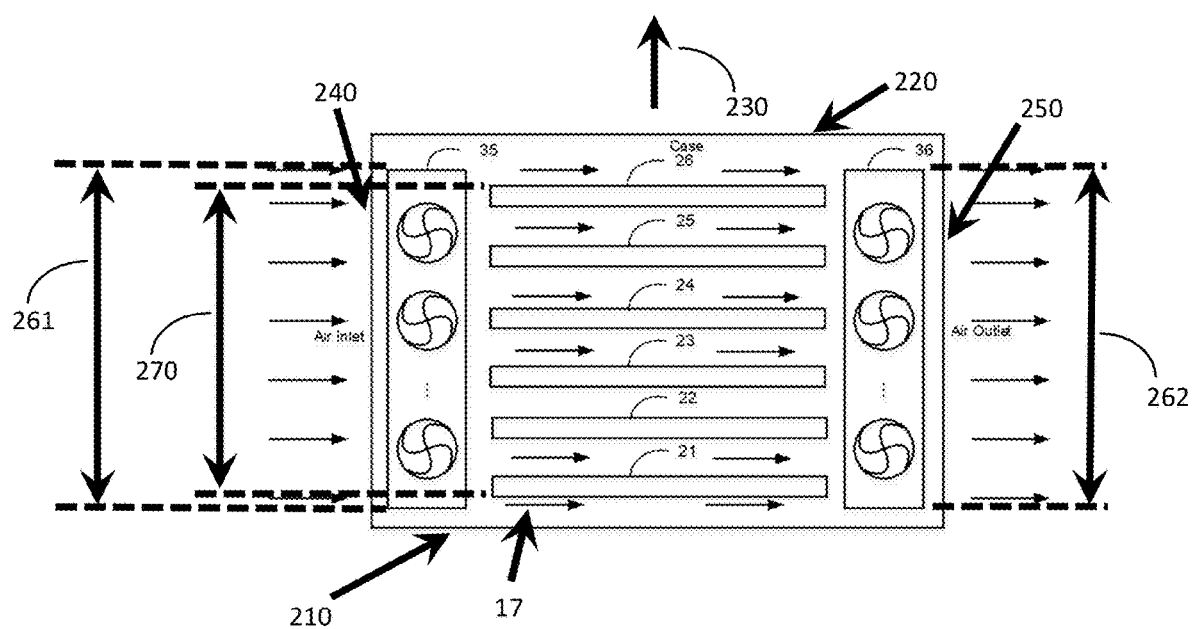
FIG. 13 is a schematic diagram showing a structure of a computer server according to Embodiment 2 of the present disclosure.

As shown in FIG. 13, a computer server is provided according to Embodiment 2 of the present disclosure. The computer server includes six layers of fixed plates. In an internal space of a case, a first layer of fixed plate 21, a second layer of fixed plate 22, a third layer of fixed plate 23, a fourth layer of fixed plate 24, a fifth layer of fixed plate 25 and a sixth layer of fixed plate 26 are arranged in a vertical direction from a bottom of the case to a top of the case. The first layer of fixed plate 21 has a motherboard and a power source as components provided thereon. The second layer of fixed plate 22 has at least one graphics card as a component provided thereon. The third layer of fixed plate 23 has at least one graphics card as a component provided thereon. The fourth layer of fixed plate 24 has at least one hard drive as a component provided thereon. The fifth layer of fixed plate 25 has at least one expansion card as a component provided thereon. The sixth layer of fixed plate 26 has at least one motherboard as a component provided thereon. An air inlet is provided on a first side panel of an outer shell of the case, and an air outlet is provided a second side panel of the outer shell of the case, the first side panel and the second side panel being opposite to each other. A height of the air inlet and a height of the air outlet in the vertical direction being equal to or greater than a height of the plurality of layers of fixed plates 21-26 in the vertical direction. A first set of fans 35 is provided on an inward-facing side of the air inlet, and a second set of fans 36 is provided on an inward-facing side of the air outlet. The first set of fans 35 and the second set of fans 36 generate a high-pressure airflow traveling in a straight direction 17 from the air inlet to the air outlet.

In Embodiment 2 of the present disclosure, the first layer of fixed plate 21, the second layer of fixed plate 22, the third layer of fixed plate 23, the fourth layer of fixed plate 24, the fifth layer of fixed plate 25 and the sixth layer of fixed plate 26 may be mounted on a third side panel and a fourth side panel (the third side panel and the fourth side panel being opposite to each other) of the outer shell of the case. For example, slots may be provided on the third side panel and the fourth side panel for mounting the first layer of fixed plate 21, the second layer of fixed plate 22, the third layer of fixed plate 23, the fourth layer of fixed plate 24, the fifth layer of fixed plate 25 and the sixth layer of fixed plate 26. Alternatively, the first layer of fixed plate 21, the second layer of fixed plate 22, the third layer of fixed plate 23, the fourth layer of fixed plate 24, the fifth layer of fixed plate 25 and the sixth layer of fixed plate 26 may be mounted fixedly to the third side panel and the fourth side panel by means of welding or fastening by screws. The present disclosure is not limited to these embodiments.

In some embodiments, the first layer of fixed plate 21, the second layer of fixed plate 22, the third layer of fixed plate 23, the fourth layer of fixed plate 24, the fifth layer of fixed plate 25 and the sixth layer of fixed plate 26 are not necessarily mounted in any strict order in the vertical direction. From the bottom to the top of the case, they may be arranged in the order of the first layer of fixed plate 21, the second layer of fixed plate 22, the third layer of fixed plate 23, the fourth layer of fixed plate 24, the fifth layer of fixed plate 25 and the sixth layer of fixed plate 26, in the order of the first layer of fixed plate 21, the third layer of fixed plate 23, the second layer of fixed plate 22, the fourth layer of fixed plate 24, the fifth layer of fixed plate 25 and the sixth layer of fixed plate 26, or in the order of the first layer of fixed plate 21, the second layer of fixed plate 22, the third layer of fixed plate 23, the fifth layer of fixed plate 25, the fourth layer of fixed plate 24 and the sixth layer of fixed plate 26. The present disclosure is not limited to any of these orders.

Figure 14:
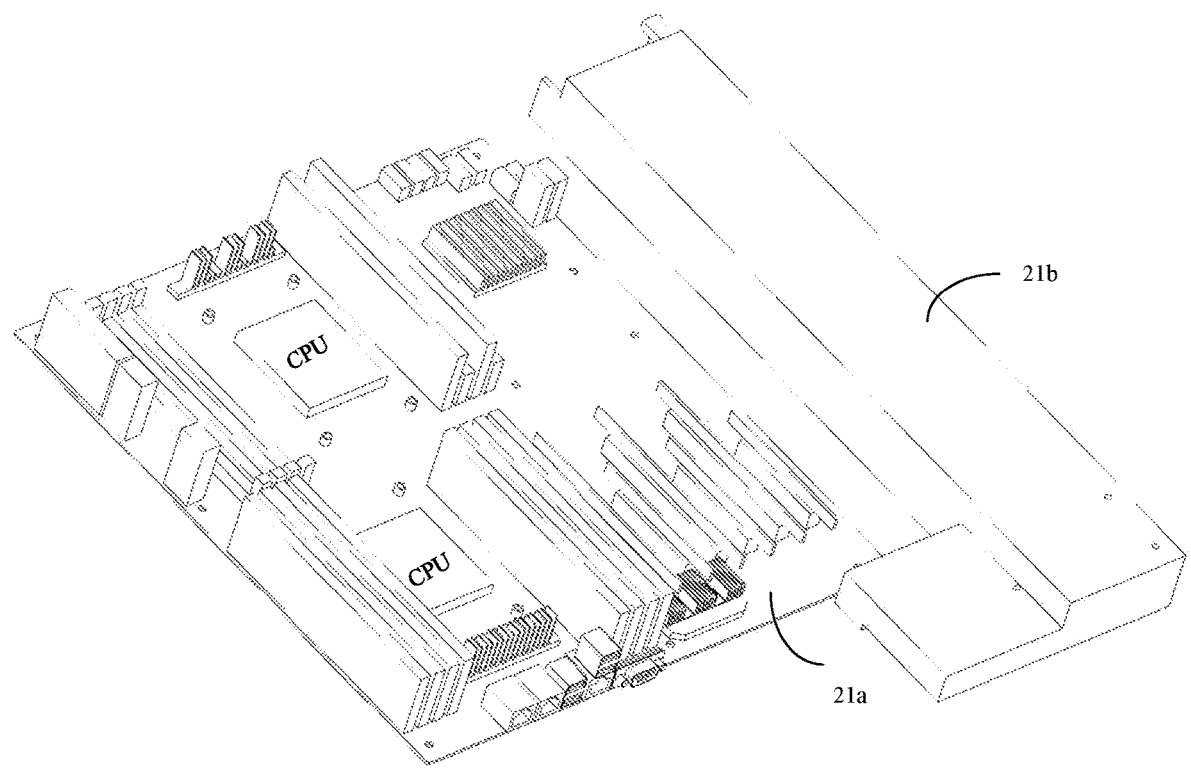
FIG. 14 is a schematic diagram showing a structure of a first layer of fixed plate according to Embodiment 2 of the present disclosure.

As shown in FIG. 14, which is a schematic diagram showing a structure of the first layer of fixed plate 21, a motherboard 21a and a power source 21b are provided on the first layer of fixed plate 21. The motherboard 21a includes two CPUs. Of course, the layout of the motherboard 21a and the power source 21b on the first layer of fixed plate 21 is not limited to the one shown in FIG. 14 and can be configured flexibly by those skilled in the art. For example, the power source 21b may be arranged on the left side in FIG. 14 and the motherboard 21a may be arranged on the right side in FIG. 14. The present disclosure is not limited to any specific layout.

Figure 15:
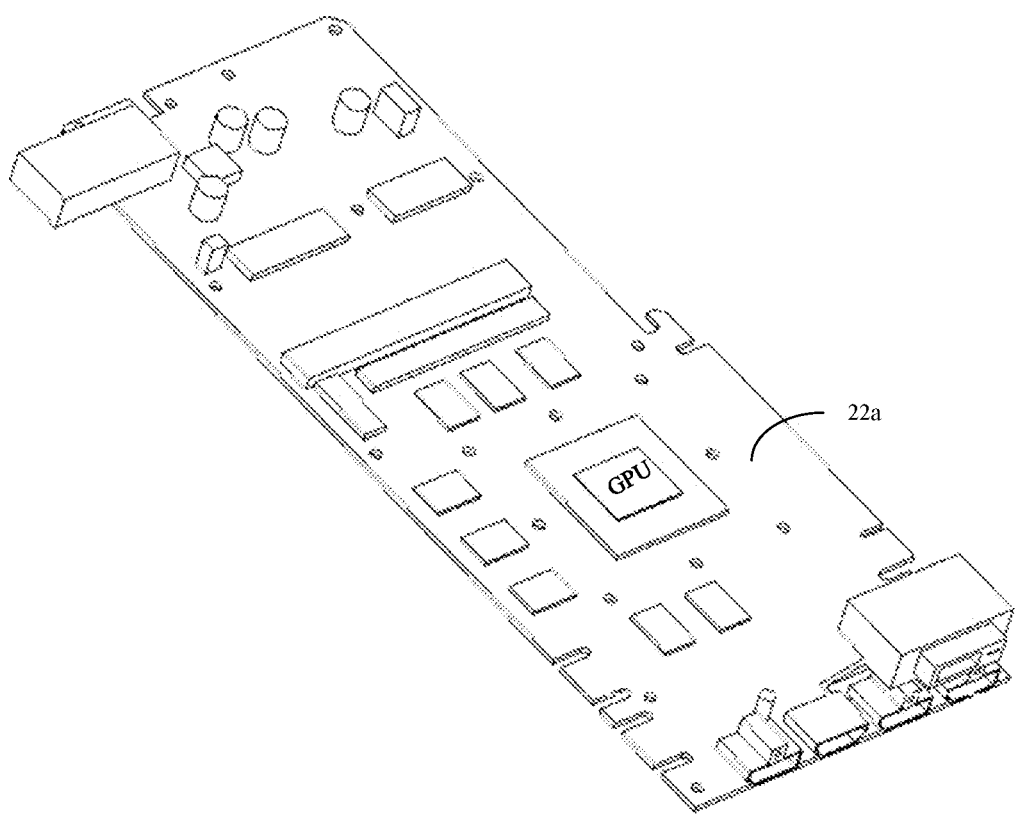
FIG. 15 is a schematic diagram showing a structure of a second layer of fixed plate according to Embodiment 2 of the present disclosure.

As shown in FIG. 15, which is a schematic diagram showing a structure of the second layer of fixed plate 22, one graphics card 22a is provided on the second layer of fixed plate 22, each graphics card 22a including a GPU.

Figure 16:
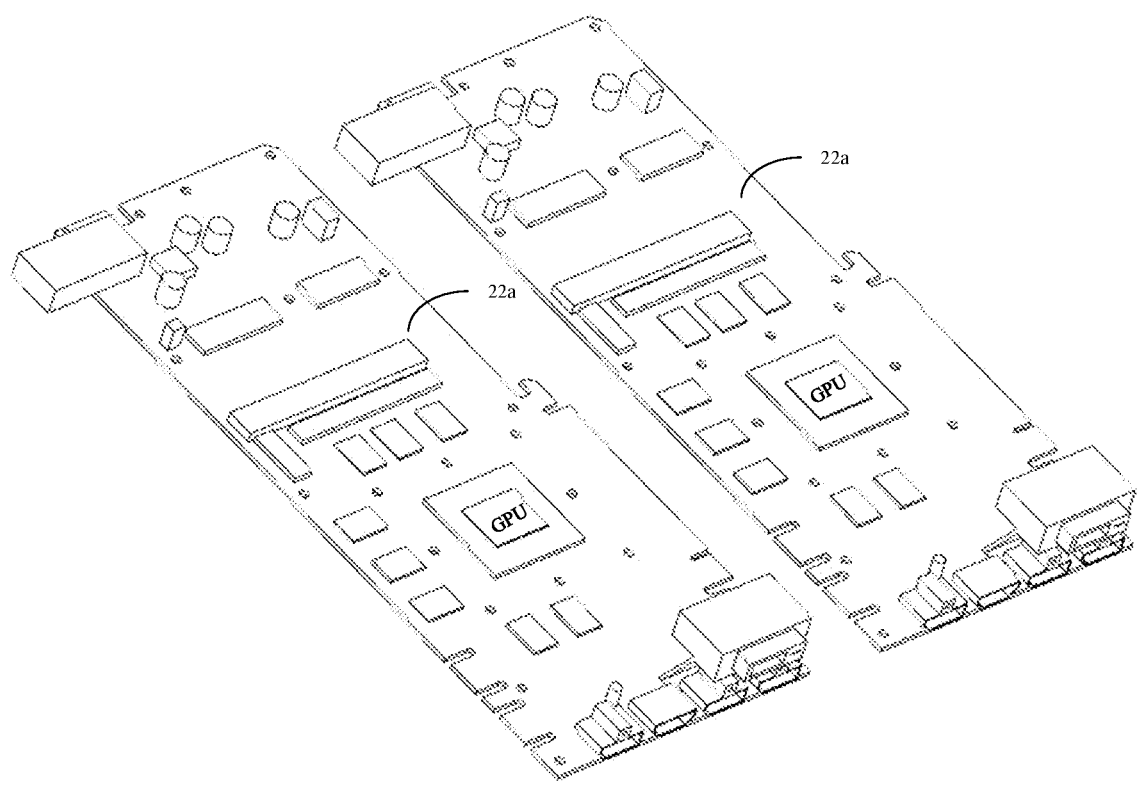
FIG. 16 is a schematic diagram showing a structure of a third layer of fixed plate according to Embodiment 2 of the present disclosure.

As shown in FIG. 16, which is a schematic diagram showing a structure of the third layer of fixed plate 23, two graphics cards 22a are provided on the third layer of fixed plate 23, each including a GPU. Of course, the layout of the two graphics card 22a is not limited to the one shown in FIG. 16 and can be configured flexibly by those skilled in the art.

Figure 17:
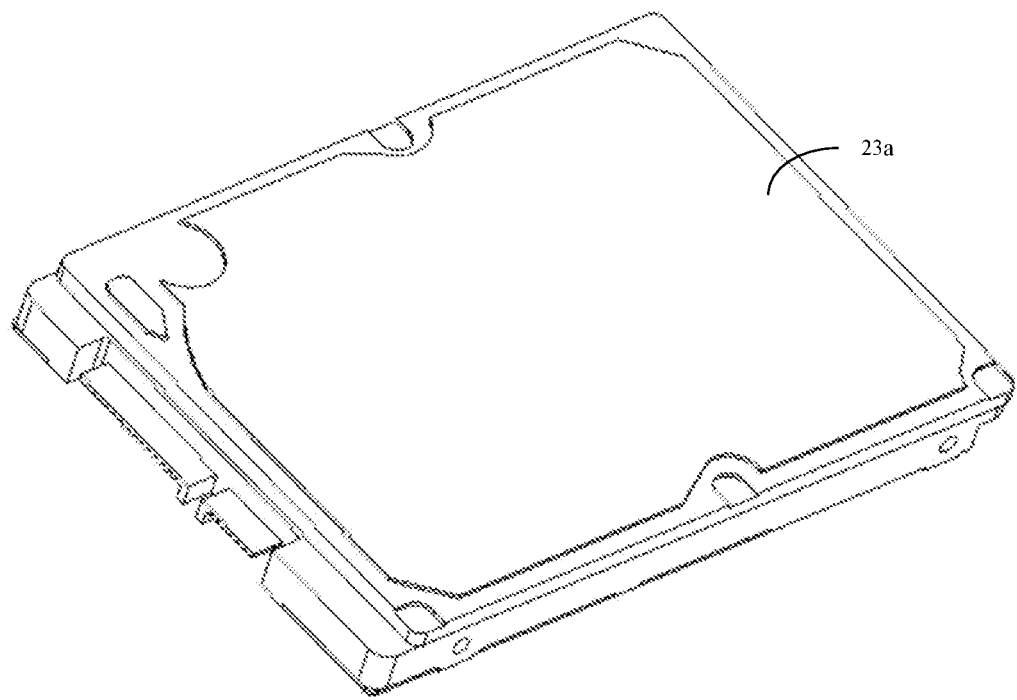
FIG. 17 is a schematic diagram showing a structure of a fourth layer of fixed plate according to Embodiment 2 of the present disclosure.

As shown in FIG. 17, which is a schematic diagram showing a structure of the fourth layer of fixed plate 24, one hard drive 24a is provided on the fourth layer of fixed plate 24.

Figure 18:
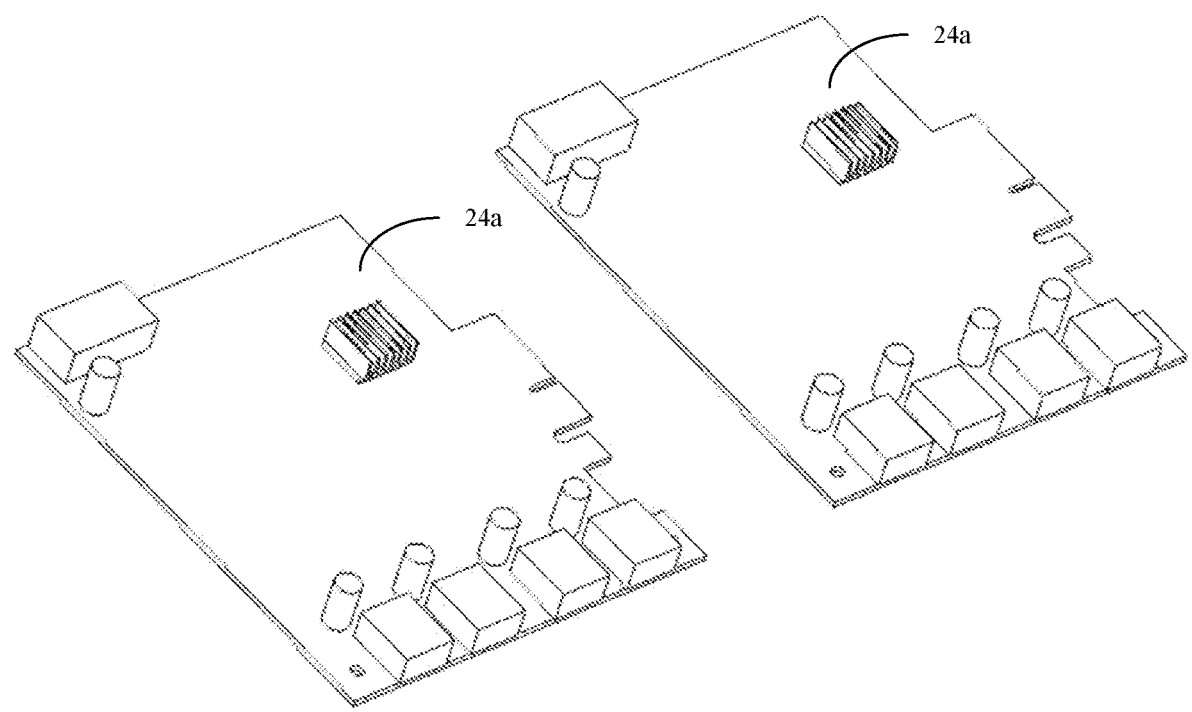
FIG. 18 is a schematic diagram showing a structure of a fifth layer of fixed plate according to Embodiment 2 of the present disclosure.

As shown in FIG. 18, which is a schematic diagram showing a structure of the fifth layer of fixed plate 25, two expansion cards 25a (which can be USB expansion cards) are provided on the fifth layer of fixed plate 25.

Figure 19:
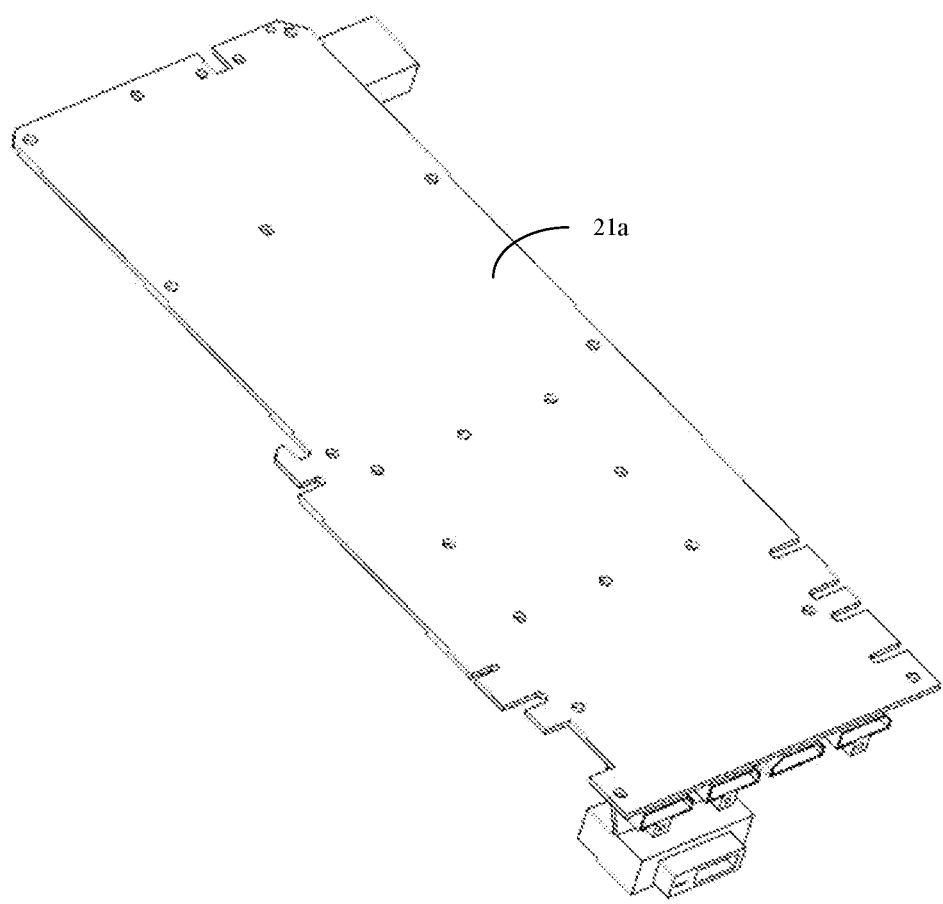
FIG. 19 is a schematic diagram showing a structure of a sixth layer of fixed plate according to Embodiment 2 of the present disclosure.

As shown in FIG. 19, which is a schematic diagram showing a structure of the sixth layer of fixed plate 26, one motherboard 21a is provided on the sixth layer of fixed plate 26 in an upside down manner.

Preferably, in some embodiments of the present disclosure, the first set of fans 35 and the second set of fans 36 may each include a plurality of fans. The number of fans in each set may be configured flexibly depending on actual requirements. For example, the more components for which heat dissipation is desired, or the larger the space for which heat dissipation is desired, the more fans may be to be mounted. For the structures of the first set of fans 35 and the second set of fans 36, reference can be made to the first set of fans 15 and the second set of fans 16 in Embodiment 1 and details thereof will be omitted here.

In order to further increase the speed of heat dissipation for the heat generating components, in some embodiments of the present disclosure, a first heat sink and a second heat sink are also provided in the case.

The first heat sink is connected to the heat generating components, for absorbing heat from the heat generating components and transferring the absorbed heat to the second heat sink. Here, the heat generating components include the CPUs on the first layer of fixed plate 21 and the sixth layer of fixed plate 26 as well as the GPUs on the second layer of fixed plate 22 and the third layer of fixed plate 23.

The second heat sink is mounted on an inward-facing side of the second set of fans 36 and cooled by the high-pressure airflow.

In the embodiments of the present disclosure, the first heat sink may transfer the heat generated by the heat generating components directly to the second heat sink, and then the first set of fans 35 and the second set of fans 36 may generate a high-pressure airflow for cooling the second heat sink. With the embodiments of the present disclosure, the first heat sink may transfer the heat generated by the heat generating components directly and quickly to the second heat sink, so as to increase the speed of heat dissipation and ensure that the heat generating components may function stably. Further, the second heat sink may be arranged near the air outlet on the outer shell of the case, such that the high-pressure airflow may dissipate the heat on the second heat sink quickly to the outside of the case, thereby further increasing the speed of heat dissipation and improving the cooling effect.

In embodiments of the present disclosure, the second heat sink may be configured as cooling fins formed in one piece, or a plurality of sets of cooling fins. This can be configured flexibly by those skilled in the art depending on actual requirements and the present disclosure is not limited to any of these configurations.

In some embodiments of the present disclosure, the first heat sink may have any of the following structures.

Structure 1: The first heat sink may include a plurality of sets of heat pipes, each set of heat pipes corresponding to one heat generating component.

Structure 2: The first heat sink may include a plurality of turbofan heat sinks each corresponding to one heat generating component.

Structure 3: The first heat sink may include at least one set of heat pipes and at least one turbofan heat sink, each set of heat pipes corresponding to one heat generating component and each turbofan heat sink corresponding to one heat generating component.

In addition to the above Structures 1, 2 and 3, in an embodiment of the present disclosure, the first heat sink may include at least one water cooling device each corresponding to a plurality of heat generating components and including a water cooling pipe and a water tank arranged cyclically.

The water cooling pipe may have a water inlet and a water outlet each connected to the water tank. Water in the water cooling pipe, when flowing through one heat generating component, carry heat generated by the one heat generating component to the second heat sink and then flow from the second heat sink and through a next heat generating component.

In order to further increase the contact area between the heat pipes and the heat generating component and thus the speed at which the heat pipes absorb the heat, in embodiments of the present disclosure, the heat generating component may have its surface coated with a layer of thermally conductive silicone grease. The one end of each heat pipe in each set of heat pipes may be connected to the heat generating component via a first mounting device.

In Embodiment 2 of the present disclosure, for the structure of the heat pipe, the structure of the turbofan heat sink, the principle for the first heat sink to absorb heat from the heat generating component and transfer the absorbed heat to the second heat sink, the structure of the first mounting device, the scheme in which the heat pipe is mounted fixedly to the heat generating component via the first mounting device, and the scheme in which the turbofan heat sink is mounted fixedly to the heat generating component, reference can be made to the corresponding description in Embodiment 1 and details thereof will be omitted here.

In Embodiment 2 of the present disclosure, each of the heat generating components in the case may each have a set of heat pipes provided thereon, or each of the heat generating components in the case may each have a turbofan heat sink provided thereon. Alternatively, some of the heat generating components may each have a turbofan heat sink provided thereon and some of the heat generating components may each have heat pipes provided thereon. For example, each CPU on the first layer of fixed plate 21 and the sixth layer of fixed plate 26 may correspond to a turbofan heat sink, and each GPU on the second layer of fixed plate 22 and the third layer of fixed plate 23 may correspond to a set of heat pipes. As another example, each CPU on the first layer of fixed plate 21 and the sixth layer of fixed plate 26 may correspond to a set of heat pipes and each GPU on the second layer of fixed plate 22 and the third layer of fixed plate 23 can correspond to a turbofan heat sink. This can be selected flexibly by those skilled in the art depending on actual requirements and the present disclosure is not limited thereto.

In order to further improve the efficiency of heat dissipation, in some embodiments of the present disclosure, a layer of cooling fins may be provided on a surface of each motherboard on the first layer of fixed plate 21 and the sixth layer of fixed plate 26 and a layer of cooling fins may be provided on a surface of each graphics card on the second layer of fixed plate 22 and the third layer of fixed plate 23, for absorbing heat generated by other components on the motherboards and the graphics cards. The layer of cooling fins provided on the surface of each motherboard or graphics card may be cooled using a high-pressure airflow.

Figure 20:
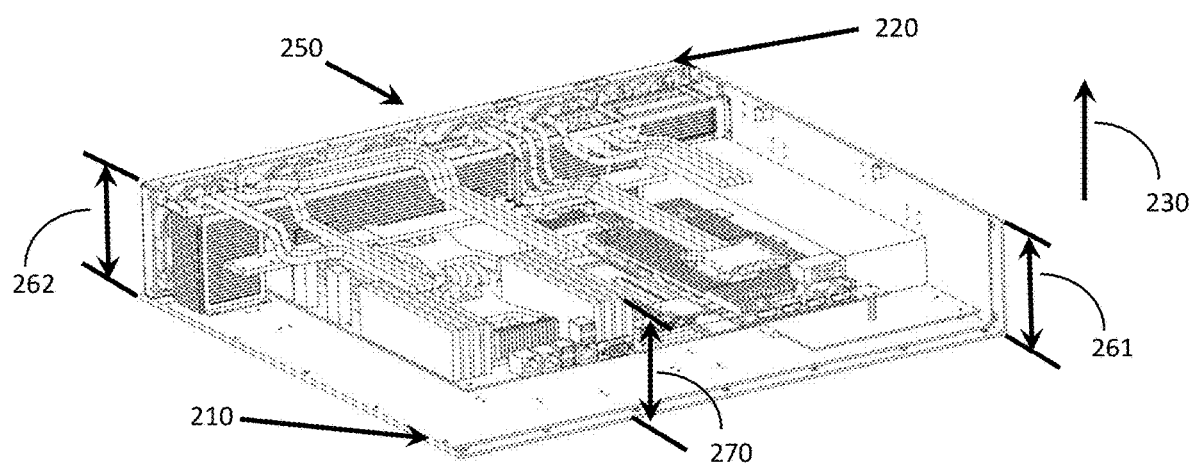
FIG. 20 is a schematic diagram showing a structure in which the first two layers of fixed plates are assembled together according to Embodiment 2 of the present disclosure.

FIG. 20 is a schematic diagram showing a structure in which the first layer of fixed plate 21, the second layer of fixed plate 22 and their corresponding heat sinks are assembled together. FIG. 20 shows examples of the positions and arrangements of the following elements: bottom 210 of the case, top 220 of the case, vertical direction 230 from the bottom to the top of the case, air outlet 250, height 261 of the air inlet in the vertical direction, height 262 of the air outlet 250 in the vertical direction, and height 270 of the plurality of layers of fixed plates in the vertical direction.

Figure 21:
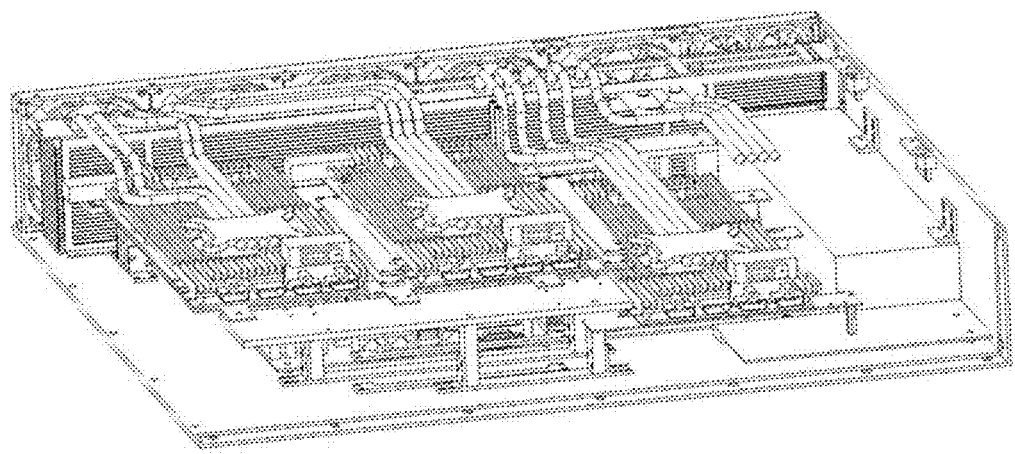
FIG. 21 is a schematic diagram showing a structure in which the first three layers of fixed plates are assembled together according to Embodiment 2 of the present disclosure.

FIG. 21 is a schematic diagram showing a structure in which the first layer of fixed plate 21, the second layer of fixed plate 22, the third layer of fixed plate 23 and their corresponding heat sinks are assembled together.

Figure 22:
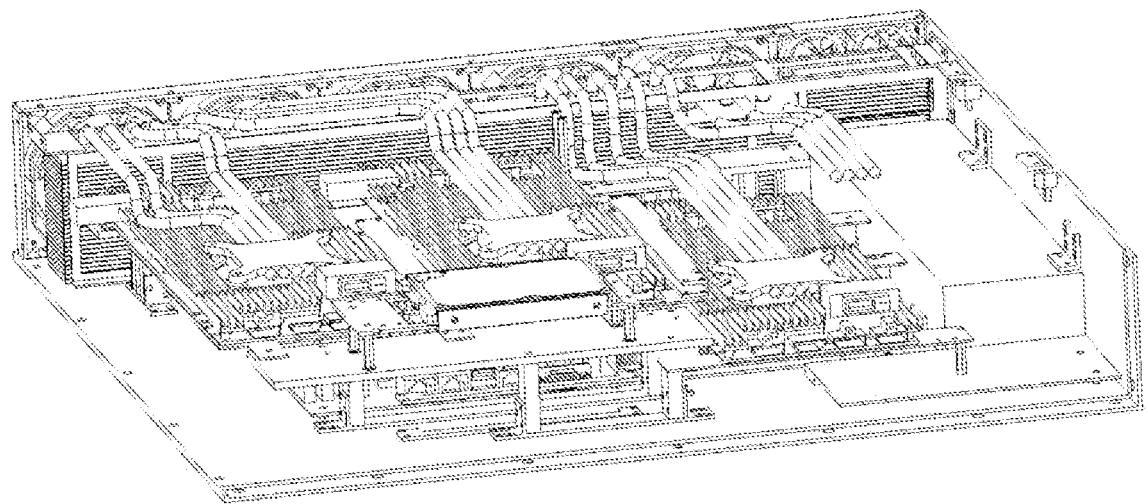
FIG. 22 is a schematic diagram showing a structure in which the first four layers of fixed plates are assembled together according to Embodiment 2 of the present disclosure.

FIG. 22 is a schematic diagram showing a structure in which the first layer of fixed plate 21, the second layer of fixed plate 22, the third layer of fixed plate 23, the fourth layer of fixed plate 24 and their corresponding heat sinks are assembled together.

Figure 23:
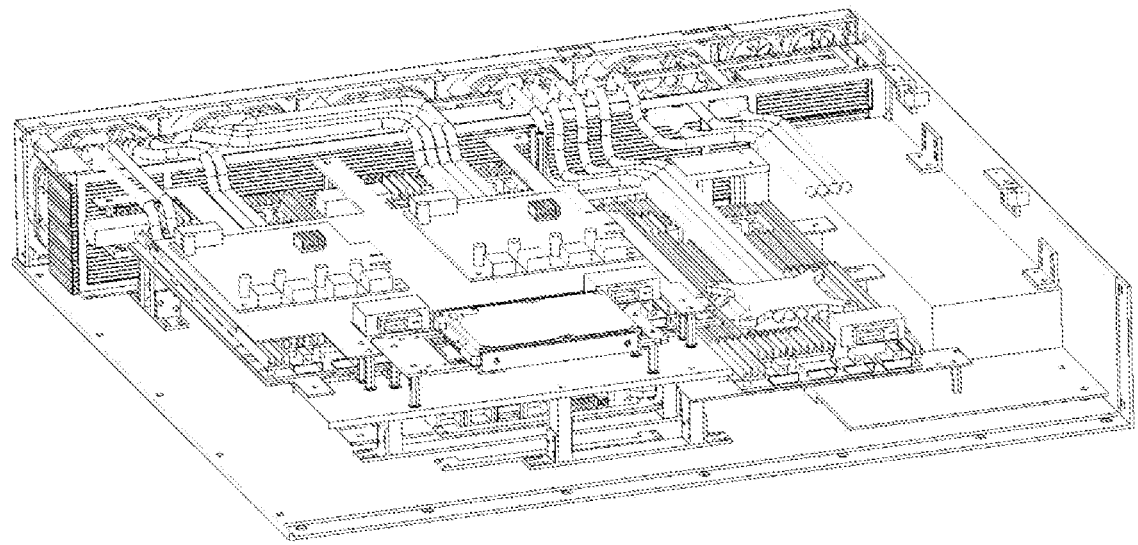
FIG. 23 is a schematic diagram showing a structure in which the first five layers of fixed plates are assembled together according to Embodiment 2 of the present disclosure.

FIG. 23 is a schematic diagram showing a structure in which the first layer of fixed plate 21, the second layer of fixed plate 22, the third layer of fixed plate 23, the fourth layer of fixed plate 24, the fifth layer of fixed plate 25 and their corresponding heat sinks are assembled together.

Figure 24:
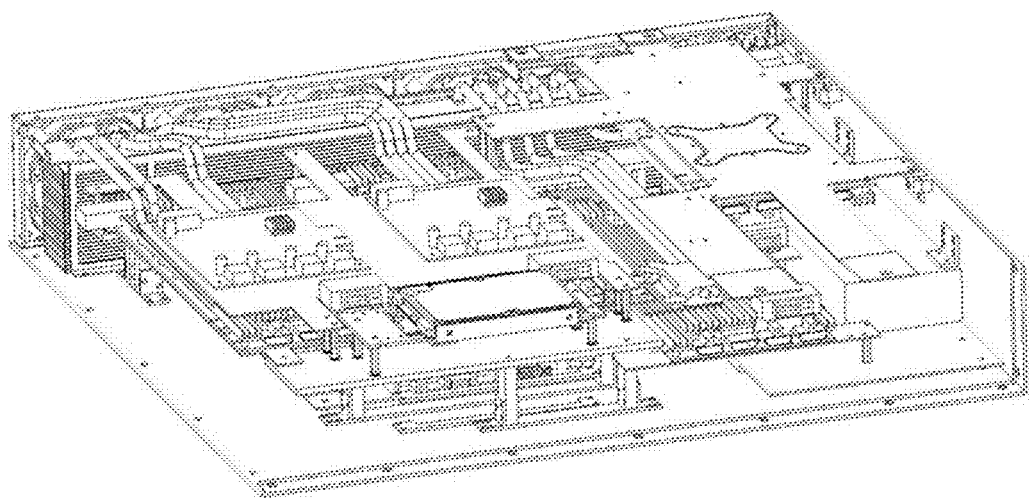
FIG. 24 is a schematic diagram showing a structure in which the first six layers of fixed plates are assembled together according to Embodiment 2 of the present disclosure.

FIG. 24 is a schematic diagram showing a structure in which the first layer of fixed plate 21, the second layer of fixed plate 22, the third layer of fixed plate 23, the fourth layer of fixed plate 24, the fifth layer of fixed plate 25, the sixth layer of fixed plate 26 and their corresponding heat sinks are assembled together.

Figure 25:
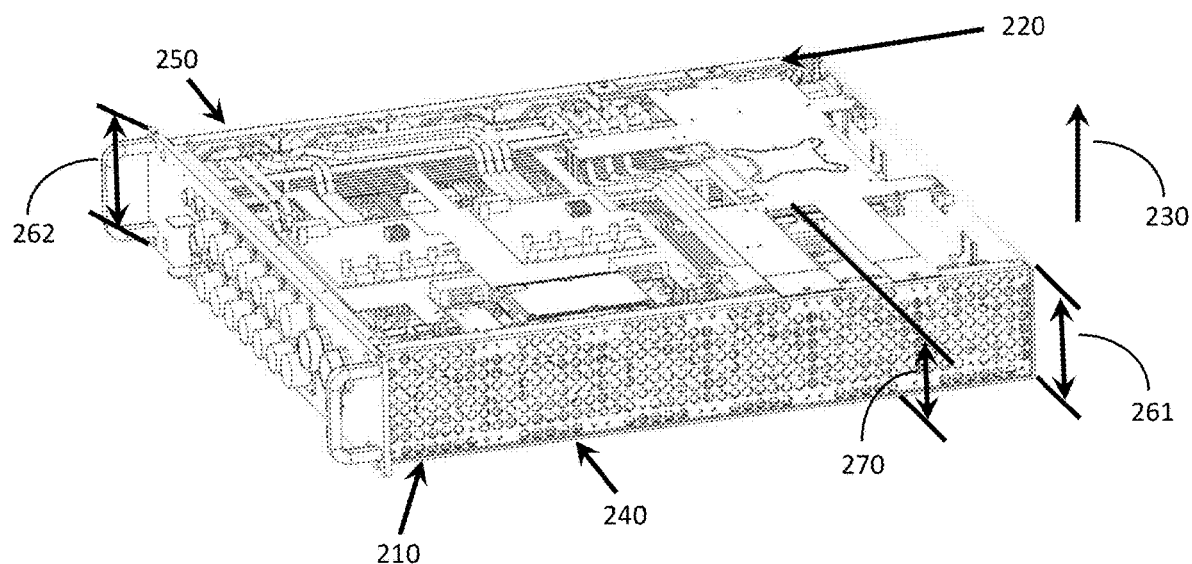
FIG. 25 is a schematic diagram showing a structure in which the first six layers of fixed plates, an outer shell of a case and sets of fans are assembled together according to Embodiment 2 of the present disclosure.

FIG. 25 is a schematic diagram showing a structure in which the first layer of fixed plate 21, the second layer of fixed plate 22, the third layer of fixed plate 23, the fourth layer of fixed plate 24, the fifth layer of fixed plate 25, the sixth layer of fixed plate 26 and their corresponding heat sinks, the outer shell of the case, the first set of fans 35 and the second set of fans 36 are assembled together according to Embodiment 2 of the present disclosure. FIG. 25 shows the following elements: bottom 210 of the case, top 220 of the case, vertical direction 230 from the bottom to the top of the case, air inlet 240, air outlet 250, height 261 of the air inlet 240 in the vertical direction, height 262 of the air outlet 250 in the vertical direction, and height 270 of the plurality of layers of fixed plates in the vertical direction. As illustrated, the height or size 262 of the air outlet 250 in the vertical direction 230 and the height 261 of the air inlet 240 in the vertical direction 230 are equal to or greater than the height 270 of the plurality of layers of fixed plates 11-14 in the vertical direction 230 which serves to provide efficient air cooling to the plurality of layers of fixed plates 11-14.

While the embodiments of the present disclosure have been described above, further alternatives and modifications can be made to these embodiments by those skilled in the art in light of the basic inventive concept of the present disclosure. The claims as attached are intended to cover the above embodiments and all these alternatives and modifications that fall within the scope of the present disclosure.

Obviously, various modifications and variants can be made to the present disclosure by those skilled in the art without departing from the spirit and scope of the present disclosure. Therefore, these modifications and variants are to be encompassed by the present disclosure if they fall within the scope of the present disclosure as defined by the claims and their equivalents.

What is claimed is:

1. A computer server, comprising, in an internal space of a case, a plurality of layers of fixed plates arranged in a vertical direction from a bottom of the case to a top of the case, each of the plurality of layers of fixed plates having at least one corresponding component provided thereon, wherein an air inlet is provided on a first side panel of an outer shell of the case, an air outlet is provided on a second side panel of the outer shell of the case, the first side panel and the second side panel being opposite to each other, a height of the air inlet and a height of the air outlet in the vertical direction being equal to or greater than a height of the plurality of layers of fixed plates in the vertical direction, a first set of fans is provided on an inward-facing side of the air inlet, and a second set of fans is provided on an inward-facing side of the air outlet, the first set of fans and the second set of fans generating a high-pressure airflow traveling in a straight direction from the air inlet to the air outlet, and the component on each of the plurality of layers of fixed plates is cooled by the high-pressure airflow.

2. The computer server of claim 1, wherein the plurality of layers of fixed plates includes a first configuration or a second configuration,
wherein the first configuration comprises:
a first layer of fixed plate having a motherboard, a hard drive and a power source provided thereon as its corresponding components;
a second layer of fixed plate having at least one graphics card provided thereon as its corresponding component;
a third layer of fixed plate having at least one graphics card provided thereon as its corresponding component; and
a fourth layer of fixed plate having at least one expansion card provided thereon as its corresponding component; and wherein
the second configuration comprises:
a first layer of fixed plate having a motherboard and a power source provided thereon as its corresponding components;
a second layer of fixed plate having at least one graphics card provided thereon as its corresponding component;
a third layer of fixed plate having at least one graphics card provided thereon as its corresponding component;
a fourth layer of fixed plate having at least one hard drive provided thereon as its corresponding component;
a fifth layer of fixed plate having at least one expansion card provided thereon as its corresponding component; and
a sixth layer of fixed plate having at least one motherboard provided thereon as its corresponding component.

3. The computer server of claim 2, further comprising a first heat sink and a second heat sink, wherein
the first heat sink is connected to a heat generating component, for absorbing heat from the heat generating component and transferring the absorbed heat to the second heat sink, the heat generating component comprising a Central Processing Unit (CPU) on the motherboard or a Graphics Processing Unit (GPU) on the graphics card, and
the second heat sink is mounted on an inward-facing side of the second set of fans and cooled by the high-pressure airflow.

4. The computer server of claim 2, wherein, in the first configuration, the second layer of fixed plate has two graphics cards provided thereon, the third layer of fixed plate has two graphics cards provided thereon, and the fourth layer of fixed plate has two expansion cards provided thereon.

5. The computer server of claim 2, wherein, in the second configuration, the second layer of fixed plate has one graphics card provided thereon, the third layer of fixed plate has two graphics cards provided thereon, the fourth layer of fixed plate has one hard drive provided thereon, the fifth layer of fixed plate has two expansion cards provided thereon, and the sixth layer of fixed plate has one motherboard provided thereon in an upside down manner.

6. The computer server of claim 3, wherein the first heat sink comprises at least one set of heat pipes, each set of heat pipes corresponding to one heat generating component and comprising at least one heat pipe each having one end connected to the one heat generating component and another end connected to the second heat sink.

7. The computer server of claim 3, wherein the first heat sink comprises at least one fan associated heat sink corresponding to one heat generating component, and
each of the at least one fan associated heat sink comprises a cooling fin connected to the heat generating component, an air outlet facing a same direction as the high-pressure airflow, and the fan drawing air to blow heat on the cooling fin to the second heat sink.

8. The computer server of claim 7, wherein the heat generating component has its surface coated with a layer of thermally conductive silicone grease, and
the cooling fin of the fan associated heat sink is mounted fixedly on the thermally conductive silicone grease for its corresponding heat generating component.

9. The computer server of claim 3, wherein the first heat sink
includes at least one of: a first group of heat sink elements or a second group of heat sink elements,
wherein the first group of heat sink elements comprises:
a set of heat pipes corresponding to one heat generating component and comprising at least one heat pipe having one end connected to the one heat generating component and another end connected to the second heat sink, and
wherein the second group of heat sink elements comprises:
a fan associated heat sink corresponding to one heat generating component and comprising a cooling fin connected to the heat generating component and an air outlet facing a same direction as the high-pressure airflow, and the fan associated heat sink drawing air to blow heat on the cooling fin to the second heat sink.

10. The computer server of claim 9, wherein the first heat sink comprises both the first group of heat sink elements and the second group of heat sink elements.

11. The computer server of claim 3, wherein the second heat sink comprises at least one set of cooling fins.

12. The computer server of claim 6, wherein the heat generating component has its surface coated with a layer of thermally conductive silicone grease, and
the one end of each heat pipe in each set of heat pipes is connected to its corresponding heat generating component via a first mounting device,
wherein the first mounting device comprises a heat pipe base and a heat pipe cover, the heat pipe base being mounted fixedly on the thermally conductive silicone grease for the heat generating component and having at least one groove or slot provided on its top for mounting the at least one heat pipe, and wherein the one end of each heat pipe in each set of heat pipes is pressed tightly onto the heat pipe base by the heat pipe cover.

13. The computer server of claim 12, wherein the heat pipe comprises a pipe shell, a wick within the pipe shell and a pipe cover for sealing the pipe shell, the pipe shell being filled with a volatile liquid having a low boiling point.

14. The computer server of claim 6, wherein the other end of each heat pipe in the set of heat pipes is connected to the second heat sink by means of welding.

15. A computer server, comprising:
a server case structured to enclose an internal space to include a plurality of layers of plates arranged in a vertical direction from a bottom of the server case to a top of the server case, each of the plurality of layers of plates is structured to include one or more heat-generating components including a central processing unit (CPU), a graphics processing unit (GPU), or other circuitry,
wherein the server case includes a first side panel forming a first external side of the server case to include an air inlet to allow air to enter the server case, a second side panel forming a second external side of the server case to include an air outlet to allow air inside the server case to exit the server case, the first side panel and the second side panel being on opposite sides of the server case,
wherein a first set of fans is provided on an inward-facing side of the air inlet to draw or drive air outside of the server case into the server case via the air inlet, and a second set of fans is provided on an inward-facing side of the air outlet to draw or drive air inside of the server case out of the server case via the air outlet so that the first set of fans and the second set of fans collectively generate a high-pressure airflow inside the server case from the air inlet to the air outlet to provide cooling to the plurality of layers of plates, and
wherein the computer server further comprises:
a first heat sink comprising a set of heat pipes comprising at least one heat pipe having one end connected to receive heat generated from at least one of the plurality of layers of plates to transfer the generated heat to a second end, and
a second heat sink mounted on an inward-facing side of the second set of fans to be cooled by the high-pressure airflow and engaged to the second end of the at least one heat pipe of the first heat sink to receive heat transferred from the first heat sink,
a layer of thermally conductive material in contact with the at least one of the plurality of layers of plates to conduct heat; and
at least one first mounting device structured to include a heat pipe base being mounted fixedly on the thermally conductive material and including at least one groove or slot for mounting the at least one heat pipe, and a heat pipe cover that is pressed the at least one heat pipe into the heat pipe base.

16. The computer server as in claim 15, wherein the thermally conductive material includes a silicone grease.

17. The computer server as in claim 15, wherein the at least one heat pipe comprises a pipe shell filled with a volatile liquid, a wick within the pipe shell, and a pipe cover for sealing the pipe shell.

18. The computer server as in claim 15, wherein the first set of fans on the air inlet and the second set of fans on the air outlet are positioned relative one another to generate the high-pressure airflow to flow in a straight line direction from the air inlet to the air outlet to provide efficient air cooling of the_plurality of layers of plates.

19. The computer server as in claim 15, wherein the first set of fans on the air inlet and the second set of fans on the air outlet are structured to have sizes of the air inlet and air outlet to be greater than a size of a spatial area occupied by the plurality of layers of plates in the high-pressure airflow between the air inlet and the air outlet so that the high-pressure airflow flows through the plurality of layers of plates flow in a straight line direction from the air inlet to the air outlet to provide efficient cooling of the plurality of layers of plates.

20. A computer server, comprising:
a server case structured to enclose an internal space to include a plurality of layers of plates arranged in a vertical direction from a bottom of the case to a top of the server case,
wherein the server case includes a first side panel forming a first external side of the server case to include an air inlet to allow air to enter the server case, a second side panel forming a second external side of the server case to include an air outlet to allow air inside the server case to exit, the first side panel and the second side panel being on opposite sides of the server case,
wherein a first set of fans is provided on an inward-facing side of the air inlet to draw or drive air outside of the server case into the server case via the air inlet, and a second set of fans is provided on an inward-facing side of the air outlet to draw or drive air inside of the server case out of the server case via the air outlet so that the first set of fans and the second set of fans collectively generate a high-pressure airflow inside the server case from the air inlet to the air outlet to provide cooling to the plurality of layers of plates,
wherein the computer server further comprises:
a first heat sink connected to receive heat generated from at least one of the plurality of layers of plates to transfer the generated heat away from the at least one of the plurality of layers of plates, and
a second heat sink mounted on an inward-facing side of the second set of fans and engaged to receive heat transferred from the first heat sink to dissipate the received heat via the high-pressure airflow,
wherein the first heat sink comprises a cooling fin connected to the at least one of the plurality of layers of plates to receive heat and a fan operable to drive air over the cooling fin in a direction that is away from the fan and is in the same direction as the high-pressure airflow so that the airflow generated by the fan and the high-pressure airflow collectively blow to blow heat on the cooling fin towards the second heat sink.

21. The computer server as in claim 20, comprising a layer of thermally conductive material in contact with the at least one of the plurality of layers of plates to conduct heat, wherein the cooling fin is mounted fixedly on the thermally conductive material.

22. The computer server as in claim 21, wherein the thermally conductive material includes a silicone grease.

23. The computer server as in claim 20, wherein the first set of fans on the air inlet and the second set of fans on the air outlet are positioned relative one another to generate the high-pressure airflow to flow in a straight line direction from the air inlet to the air outlet to provide efficient air cooling of the plurality of layers of plates.

24. The computer server as in claim 20, wherein the first set of fans on the air inlet and the second set of fans on the air outlet are structured to have sizes of the air inlet and air outlet to be greater than a size of a spatial area occupied by the plurality of layers of plates in the high-pressure airflow between the air inlet and the air outlet so that the high-pressure airflow flows through the plurality of layers of plates flow in a straight line direction from the air inlet to the air outlet to provide efficient cooling of the plurality of layers of plates.

* * * * *

UNITED STATES PATENT AND TRADEMARK OFFICE
CERTIFICATE OF CORRECTION

PATENT NO. : 10,791,653 B2
APPLICATION NO. : 16/242881
DATED : September 29, 2020
INVENTOR(S) : Zhihua Ma Page 1 of 1

It is certified that error appears in the above-identified patent and that said Letters Patent is hereby corrected as shown below:

On the Title Page

Below item (65), insert -- (30) Foreign Application Priority Data
Nov. 8, 2017 (CN) ......... 201711088369.2 --.

In the Specification

In Column 4, Line 22, delete "provided a second" and insert -- provided on a second --, therefor.

In Column 4, Line 64, delete "provided a second" and insert -- provided on a second --, therefor.

In Column 8, Lines 25-26, delete "1.3*10-1~1.3*10-4" and insert -- $1.3*10^{-1}$~$1.3*10^{-4}$ --, therefor.

In Column 10, Line 52, delete "provided a second" and insert -- provided on a second --, therefor.

In the Claims

In Column 16, Lines 25-26, in Claim 9, delete "includes at least one of: a first group of heat sink elements or a second group of heat sink elements," and insert the same at Line 24, after "sink" as a continuation point.

In Column 17, Line 56, in Claim 18, delete "relative one another" and insert -- relative to one another --, therefor.

In Column 17, Line 59, in Claim 18, delete "the_plurality" and insert -- the plurality --, therefor.

In Column 18, Line 52, in Claim 23, delete "relative one another" and insert -- relative to one another --, therefor.

Signed and Sealed this
Twelfth Day of January, 2021

Andrei Iancu
*Director of the United States Patent and Trademark Office*